United States Patent
Harutyunyan et al.

(10) Patent No.: US 11,981,996 B2
(45) Date of Patent: May 14, 2024

(54) MOISTURE GOVERNED GROWTH METHOD OF ATOMIC LAYER RIBBONS AND NANORIBBONS OF TRANSITION METAL DICHALCOGENIDES

(71) Applicant: HONDA MOTOR CO., LTD., Tokyo (JP)

(72) Inventors: Avetik R. Harutyunyan, Santa Clara, CA (US); Xufan Li, Dublin, OH (US)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 18/051,962

(22) Filed: Nov. 2, 2022

(65) Prior Publication Data
US 2023/0141275 A1 May 11, 2023

Related U.S. Application Data

(60) Division of application No. 17/148,129, filed on Jan. 13, 2021, now Pat. No. 11,519,068, which is a
(Continued)

(51) Int. Cl.
*C01G 39/06* (2006.01)
*B82Y 30/00* (2011.01)
(Continued)

(52) U.S. Cl.
CPC ........ *C23C 16/45529* (2013.01); *C01G 39/06* (2013.01); *C01G 49/00* (2013.01);
(Continued)

(58) Field of Classification Search
CPC ..... B82Y 30/00; B82Y 40/00; C01P 2004/17; C23C 16/45529; C23C 16/0272;
(Continued)

(56) References Cited

U.S. PATENT DOCUMENTS 8,330,136 B2  12/2012  Zheng et al.
9,449,843 B1  9/2016  Korolik et al.
(Continued)

FOREIGN PATENT DOCUMENTS

CN  108588673 A  9/2018
CN  110156020 A  8/2019
(Continued)

OTHER PUBLICATIONS

Xiao "Edge preference and band gap characters of MoS2 and WS2 nanoribbons." Surface Science vol. 653, Nov. 2016, pp. 107-112 (Year: 2016).*
(Continued)

*Primary Examiner* — Tri V Nguyen
(74) *Attorney, Agent, or Firm* — ArentFox Schiff LLP; Mark Duell

(57) ABSTRACT

A method of making an atomic layer nanoribbon that includes forming a double atomic layer ribbon having a first monolayer and a second monolayer on a surface of the first monolayer, wherein the first monolayer and the second monolayer each contains a transition metal dichalcogenide material, oxidizing at least a portion of the first monolayer to provide an oxidized portion, and removing the oxidized portion to provide an atomic layer nanoribbon of the transition metal dichalcogenide material. Also provided are double atomic layer ribbons, double atomic layer nanoribbons, and single atomic layer nanoribbons prepared according to the method.

15 Claims, 26 Drawing Sheets

Related U.S. Application Data continuation-in-part of application No. 16/912,077, filed on Jun. 25, 2020, now Pat. No. 11,408,073.

(60) Provisional application No. 63/011,075, filed on Apr. 16, 2020.

(51) Int. Cl.
| | |
|---|---|
| C01G 49/00 | (2006.01) |
| C01G 53/11 | (2006.01) |
| C23C 16/44 | (2006.01) |
| C23C 16/448 | (2006.01) |
| C23C 16/455 | (2006.01) |
| C23C 16/56 | (2006.01) |
| B82Y 40/00 | (2011.01) |

(52) U.S. Cl.
CPC .......... *C01G 53/11* (2013.01); *C23C 16/4402* (2013.01); *C23C 16/4482* (2013.01); *C23C 16/45553* (2013.01); *C23C 16/56* (2013.01); *B82Y 30/00* (2013.01); *B82Y 40/00* (2013.01); *C01P 2004/17* (2013.01)

(58) Field of Classification Search
CPC ............. C23C 16/305; H01L 21/02502; H01L 21/02568; C01G 39/06; C01G 53/11
USPC ........................................................ 428/698
See application file for complete search history.

(56) References Cited

U.S. PATENT DOCUMENTS

| | | | |
|---|---|---|---|
| 10,309,011 | B2 | 6/2019 | Kang et al. |
| 10,832,906 | B2 | 11/2020 | Li et al. |
| 11,408,073 | B2 | 8/2022 | Harutyunyan et al. |
| 11,519,068 | B2 | 12/2022 | Harutyunyan et al. |
| 2006/0239882 | A1 | 10/2006 | Seo et al. |
| 2008/0085226 | A1 | 4/2008 | Fondurulia et al. |
| 2009/0226361 | A1 | 9/2009 | Campos-Delgado et al. |
| 2010/0105834 | A1 | 4/2010 | Tour et al. |
| 2013/0093048 | A1 | 4/2013 | Chang et al. |
| 2014/0197459 | A1 | 7/2014 | Kis et al. |
| 2014/0251204 | A1 | 9/2014 | Najmaei et al. |
| 2015/0108431 | A1 | 4/2015 | Kim |
| 2016/0122868 | A1 | 5/2016 | Km et al. |
| 2016/0168694 | A1 | 6/2016 | Min |
| 2016/0233322 | A1 | 8/2016 | Yeh et al. |
| 2016/0301075 | A1 | 10/2016 | Zhamu et al. |
| 2016/0372553 | A1 | 12/2016 | Xiao |
| 2017/0175258 | A1 | 6/2017 | Robinson et al. |
| 2017/0267527 | A1 | 9/2017 | Kim et al. |
| 2017/0276641 | A1 | 9/2017 | Harutyunyan et al. |
| 2018/0151763 | A1 | 5/2018 | Heo et al. |
| 2019/0051466 | A1 | 2/2019 | Zhamu et al. |
| 2019/0229252 | A1 | 7/2019 | Leblanc et al. |
| 2019/0279870 | A1 | 9/2019 | Mane et al. |
| 2019/0362971 | A1 | 11/2019 | Wong et al. |
| 2019/0372093 | A1 | 12/2019 | Zhamu et al. |
| 2019/0382893 | A1 | 12/2019 | Mane et al. |
| 2019/0390950 | A1 | 12/2019 | Lin et al. |
| 2020/0006690 | A1 | 1/2020 | Falk et al. |
| 2020/0277699 | A1 | 9/2020 | Harutyunyan |
| 2021/0324515 | A1 | 10/2021 | Harutyunyan et al. |
| 2021/0324522 | A1 | 10/2021 | Harutyunyan et al. |
| 2022/0106681 | A1 | 4/2022 | Harutyunyan et al. |
| 2022/0278276 | A1 | 9/2022 | Medina Silva et al. |

FOREIGN PATENT DOCUMENTS

| | | |
|---|---|---|
| EP | 3 575 436 A1 | 12/2019 |
| JP | 2018-123039 A | 8/2018 |
| KR | 10-2017-0115172 A | 10/2017 |
| WO | WO 2015/091781 A2 | 6/2015 |
| WO | WO2016/122741 A2 | 8/2016 |
| WO | WO2018/022034 A1 | 2/2018 |
| WO | WO-2018075538 A1 * | 4/2018 .......... H01M 10/052 |

OTHER PUBLICATIONS

Duan "Two-dimensional transition metal dichalcogenides as atomically thin semiconductors: opportunities and challenges." Chem. Soc. Rev., 2015, 44, 8859--8876 (Year: 2015).*

Yang et al., "Deriving MoS2 nanoribbons from their flakes by chemical vapor deposition," Nanotechnology, Apr. 2019, vol. 30, No. 25, 255602, pp. 1-7.

Wang et al., "NaCl-assisted one-step growth of MoS2-WS2 in-plane heterostructures," Nanotechnology, Jul. 2017, vol. 28, No. 32, 325602, pp. 1-10.

Abhay Dasadia et al., "Growth, structure, electrical and optical properties of transition metal chalcogenide crystals synthesized by improved chemical vapor transport technique for semiconductor technologies", Progress in Crystal Growth and Characterization of Materials 68 (2022) 100578, pp. 1-27.

Joshua O. Island et al., "Ultrahigh Photoresponse of Few-Layer TiS3 Nanoribbon Transistors", Advanced Optical Materials, (2014), 2, pp. 641-645.

Naunidh Virk et al., "Dirac fermions at high-index surfaces of bismuth chalcogenide topological insulator nanostructures", Scientific Reports, 6, (2020), pp. 1-9.

Sharoon Griffin et al., "Resuspendable Powders of Lyophilized Chalcogen Particles with Activity against Microorganisms", Antioxidants, (2018), 7, 23, pp. 1-19.

Xuechao YU, et al., "Atomically thin noble metal dichalcogenide: a broadband mid-infrared semiconductor", Nature Communications, (2018) 9:1545, pp. 1-9.

Jiawen You et al., "Synthesis of 2D transition metal dichalcogenides by chemical vapor deposition with controlled layer number and morphology", Nano Covergence (2018) 5:26, pp. 1-13.

Kun Xu et al., "Theoretical Study of Atomic Layer Deposition Reaction Mechanism and Kinetics for Aluminum Oxide Formation at Graphene Nanoribbon Open Edges", J. Phys. Chem. C 2010, 114, 2010 American Chemical Society, pp. 10505-10511.

Shashank Balasubramanyam et al., "Area-Selective Atomic Layer Deposition of Two-Dimensional WS2 Nanolayers", ACS Materials Letters 2020, 2, 5, 2020 American Chemical Society, pp. 511-518. (publication date Apr. 8, 2020).

Xuechao Yu et al., "Mobility Enhancement of Graphene Nanoribbon by ALD HfO2 and Its Optoelectronic Properties", 2015 Conference on Lasers and Electro-Optics (CLEO), 2015 Optical Society of America, 2015, pp. 1-2.

Xufan Li et al., "Surfactant-Mediated Growth and Patterning of Atomically Thin Transition Metal Dichalcogenides",https://dx.doi.org/10.1021/acsnano.0c00132, ACS Nano 2020, 14, pp. 6570-6581, 2020 American Chemical Society.

Anjna Devi et al., "Novel properties of transition metal dichalcogenides monolayers and nanoribbons (MX2, where M=Cr, Mo, W and X=S, Se): A spin resolved study", Materials Science and Engineering B, 271, 115237, pp. 1-8, (2021).

Areej Aljarb et al., "Ledge-directed epitaxy of continuously self-aligned single-crystalline nanoribbons of transition metal dichalcogenides", Nature Materials, vol. 19, Dec. 2020, (pp. 1300-1306, 8 Pages total).

Daphne Davelou et al., "Nanoribbon edges of transition-metal dichalcogenides: Stability and electronic properties", Physical Review B 96, 165436 (2017), American Physical Society, pp. 165436-1 to 165436-6.

Georg S. Duesberg et al., "Investigation of 2D Transition Metal Dichalcogenide Films for Electronic Devices", EUROSOI-ULIS 2015: 2015 Joint International EUROSOI Workshop and International Conference on Ultimate Integration on Silicon, 2015, pp. 73-76(4 Pages Total).

Gyu-Hyeon Park et al., "2D Transition Metal Dichalcogenide Thin Films Obtained by Chemical Gas Phase Deposition Techniques", Advanced Materials Interfaces 2019, 6,, Atomic Layer Deposition, 1800688, (31 Pages Total).

(56) References Cited

OTHER PUBLICATIONS

Liang Ma et al., "Recent Progress and Challenges in Graphene Nanoribbon Synthesis", ChemPhysChem MINIREVIEWS, ChemPubSoc Europe, 2013, 14, pp. 47-54.

Roberto C. Longo et al., "Intrinsic air stability mechanisms of two-dimensional transition metal dichalcogenide surfaces: basal versus edge oxidation", 2D Materials 4, IOP Publishing, (2017) 025050, (11 Pages Total).

Sajedeh Manzeli et al., "2D transition metal dichalcogenides",. Nature Reviews Materials 2, 17033 (2017), Abstract Only (2 Pages Total).

Sang A. Han et al., "Synthesis, properties and potential applications of two-dimensional transition metal dichalcogenides", Nano Convergence (2015) 2:17, pp. 1-14.

Sheng-Xuan Xia et al., "Plasmonically induced transparency in double-layered graphene nanoribbons", Photonics Research, vol. 6, No. 7, Jul. 2018, pp. 692-702.

Sihan Chen et al., "Monolayer MoS2 Nanoribbon Transistors Fabricated by Scanning Probe Lithography", Nano Letters 2019, 19, ACS Publications, American Chemical Society, pp. 2092-2098.

Wonbong Choi et al., "Recent development of two-dimensional transition metal dichalcogenides and their applications". Materials Today, vol. 20, No. 3, Apr. 2017, Elsevier, pp. 116-130.

Yi Xuan et al., "Atomic-layer-deposited nanostructures for graphene-based nanoelectronics", Applied Physics Letters 92, 013101, 2008, American Institute of Physics, (3 Pages total).

Zheng Liu et al., "Identification of active atomic defects in a monolayered tungsten disulphide nanoribbon", Nature Communications, 2:213, pp. 1-5, (2011).

Zixing Wang et al., "Etching of Transition Metal Dichalcogenide Monolayers into Nanoribbon Arrays", Nanoscale Horizons, 4, Communication, Royal Society of Chemistry, 2019, pp. 689-696.

Office Action in CN202110398305.2, mailed Jan. 11, 2024, 21 pages.

Li et al., "Vapour-liquid-solid growth of monolayer MoS2 nanoribbons," Nature Materials, Jun. 2018, vol. 17, pp. 535-542.

\* cited by examiner

MOISTURE GOVERNED GROWTH METHOD OF ATOMIC LAYER RIBBONS AND NANORIBBONS OF TRANSITION METAL DICHALCOGENIDES

CROSS-REFERENCE TO RELATED APPLICATIONS

This application is a Divisional application of U.S. patent application Ser. No. 17/148,129, entitled "MOISTURE GOVERNED GROWTH METHOD OF ATOMIC LAYER RIBBONS AND NANORIBBONS OF TRANSITION METAL DICHALCOGENIDES", filed on Jan. 13, 2021, which is a continuation-in-part of U.S. patent application Ser. No. 16/912,077, entitled "METHOD FOR GROWTH OF ATOMIC LAYER RIBBONS AND NANORIBBONS OF TRANSITION METAL DICHALCOGENIDES," filed on Jun. 25, 2020, which issued as U.S. Pat. No. 11,408,073, on Aug. 9, 2022, and which claims priority to U.S. Provisional Application No. 63/011,075, entitled "METHOD FOR GROWTH OF ATOMIC LAYER RIBBONS AND NANORIBBONS OF TRANSITION METAL DICHALCOGENIDES," filed on Apr. 16, 2020. This application also claims priority to U.S. Provisional Application No. 63/011,075. The contents of these applications are expressly incorporated by reference herein in their entirety.

BACKGROUND

Atomically-thin (i.e., two-dimensional) materials such as graphene and transition metal dichalcogenides (TMDs) have triggered tremendous interest in both fundamental science and practical applications because of their reduced dimensions, which provide intriguing physical and chemical properties and thereby unique applications. Methods for synthesizing atomically thin TMDs in single crystal flakes, large-area films, as well as directly in specific patterns are described, for example, in Li, et al., "Surfactant-Mediated Growth and Patterning of Atomically Thin Transition Metal Dichalcogenides," *ACS Nano*, vol. 10, 2020, pp. 6570-6581, and in U.S. Pat. No. 10,832,906, issued Nov. 10, 2020, the contents of which are expressly incorporated by reference herein in their entirety. In particular, ribbons and nanoribbons of TMDs, with an additional space confinement in the two-dimensional plane (i.e., ribbon-like morphologies, generally with a length-to-width ratio of greater than 1000) and a more prominent edge effect compared to two-dimensional sheets, have the potential to provide even more unprecedented properties according to theoretical predictions. Therefore, synthesis and fabrication approaches for providing atomically-thin TMD ribbons and nanoribbons are highly desired.

SUMMARY

The present disclosure is directed to a method of preparing atomic layer ribbons and nanoribbons of a TMD material. According to some aspects, the method comprises forming a double atomic layer ribbon comprising a first monolayer and a second monolayer positioned on a surface of the first monolayer, and removing at least a portion of the double atomic layer ribbon to provide an atomic layer nanoribbon of a TMD material as described herein. According to some aspects, forming the double atomic layer ribbon may comprise contacting two or more precursor powders with a gas having a certain moisture content. The present disclosure is also directed to double atomic layer ribbons and nanoribbons, and single atomic layer nanoribbons, prepared according to the methods as described herein.

DETAILED DESCRIPTION

Figure 1A:
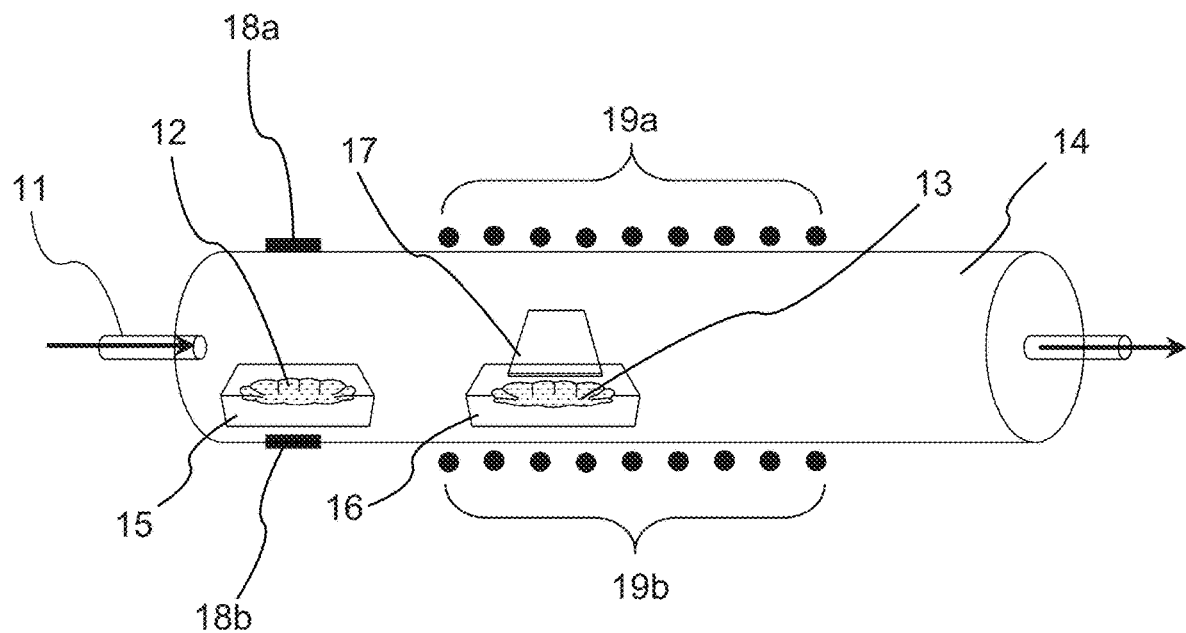
FIG. 1A shows an example schematic of the CVD growth in the method according to the present disclosure.

The present disclosure is directed to a method of preparing atomic layer ribbons and nanoribbons of a TMD material. According to some aspects, the method comprises forming a double atomic layer ribbon comprising a first monolayer and a second monolayer positioned on a surface of the first monolayer, and removing at least a portion of the double atomic layer ribbon to provide an atomic layer nanoribbon of a TMD material as described herein. According to some aspects, forming the double atomic layer ribbon may comprise contacting two or more precursor powders with a mixed gas having a certain moisture content. The present disclosure is also directed to double atomic layer ribbons and nanoribbons, and single atomic layer nanoribbons, prepared according to the methods as described herein.

As used herein, the term "ribbon" refers to an elongated structure, that is, a structure with a length-to-width ratio of greater than 500, optionally greater than 1000. As used herein, the term "nanoribbon" refers to a ribbon with at least one dimension on the nanoscale, for example, a ribbon having a width of between about 1 and 100 nm.

According to some aspects, the method comprises forming a double atomic layer ribbon comprising a first monolayer and a second monolayer positioned on a surface of the first monolayer, wherein forming the double atomic layer ribbon may comprise subjecting two or more precursor powders to conditions sufficient to deposit monolayers of a TMD material onto a substrate via chemical vapor deposition (CVD). The two or more precursor powders may comprise a metal oxide powder and a chalcogen powder.

It should be understood that the metal oxide powder and the chalcogen powder may be selected in order to provide a certain TMD material. For example, the metal oxide powder may comprise molybdenum dioxide ($MoO_2$) and the chalcogen powder may comprise sulfur (S) to provide a TMD material comprising molybdenum disulfide ($MoS_2$). Additionally or alternatively, tungsten dioxide ($WO_2$) and/or tungsten trioxide ($WO_3$) may be used as a metal oxide powder and/or selenium (Se) may be used as a chalcogen powder such that the TMD material may comprise tungsten disulfide ($WS_2$) and/or molybdenum diselenide ($MoSe_2$) and/or tungsten diselenide ($WSe_2$).

According to some aspects, the two or more precursor powders may additionally comprise a salt powder. As used herein, the term "salt" refers to an electrically neutral ionic compound having cation(s) and anion(s). Examples of salts usefulness according to the present disclosure include, but are not limited to, sodium salts and potassium salts, such as NaBr, NaCl, KBr, KCl, and combinations thereof.

According to some aspects, the two or more precursor powders may comprise a metal powder. The metal powder may comprise a metal that is the same as the metal comprised by the metal oxide powder or different from the metal comprised by the metal oxide powder. According to some aspects, the metal powder may comprise a transition metal such as nickel (Ni), iron (Fe), or a combination thereof.

As used herein, the term "powder" refers to particulate matter having an average particle size. For example, each of the two or more precursor powders may independently comprise particulate matter having an average particle size of between about 1 nm and 100 μm. According to some aspects, at least one of the two or more precursor powders may comprise particulate matter having an average particle size of between about 1 and 100 nm. According to some aspects, at least one of the two or more precursor powders may comprise particulate matter having an average particle size of between about 1 and 100 μm. According to some aspects, each of the two or more precursor powders may comprise the same average particle size as and/or a different average particle size from the average particle size of another precursor powders.

According to some aspects, the substrate may comprise any inert material suitable for use according to the method as described herein. Examples of substrates useful according to the present disclosure include, but are not limited to, substrates comprising or consisting of $SiO_2$, Si, Au, c-sapphire, fluorophlogopite mica, $SrTiO_3$, h-BN, or combinations thereof.

The method may comprise subjecting the two or more precursor powders to a moisturized gas flow at an elevated temperature sufficient to deposit monolayers of a TMD material on a substrate via chemical vapor deposition. As used herein, the term "moisturized gas" refers to a gas that contains a measurable concentration of acceptable moisture. For example, the moisturized gas flow may comprise one or more inert gasses and a measurable concentration of acceptable moisture. According to some aspects, acceptable moisture may comprise or consist of deionized (DI) water. Example inert gasses useful according to the present disclosure include, but are not limited to, argon gas (Ar), nitrogen gas (N), and combinations thereof.

The moisturized gas flow (expressed as $F_{inert+water}$) may be provided by combining a first inert gas flow (expressed as $F_{inert1}$) with DI water, for example, by flowing a first inert gas flow through a bubbler containing DI water to provide a first moisturized inert gas (expressed as $F_{inert1+water}$). According to some aspects, the moisturized gas flow ($F_{inert+water}$) may consist of the first moisturized inert gas ($F_{inert1+water}$). Alternatively, the first moisturized inert gas ($F_{inert1+water}$) may be combined with a second inert gas flow (expressed as $F_{inert2}$) in order to provide the moisturized gas flow ($F_{inert+water}$) as described herein. The optional second inert gas flow ($F_{inert2}$) may comprise an inert gas as described herein that is the same as or different from the inert gas comprised by the first inert gas flow ($F_{inert1}$).

According to some aspects, providing the moisturized gas flow ($F_{inert+water}$) as described herein may further comprise removing at least a portion of impurity moisture from the first inert gas flow ($F_{inert1}$) and/or the second inert gas flow ($F_{inert2}$). As used herein, "impurity moisture" may refer to any inadvertent moisture contained in a gas. For example, impurity moisture contained by the first and/or second inert gas flows may be moisture provided by a gas cylinder and/or a surrounding atmosphere. According to some aspects, at least a portion of impurity moisture may be removed from the first inert gas flow ($F_{inert1}$) prior to flowing the first inert gas flow ($F_{inert1}$) through a bubbler containing DI water to provide the first moisturized inert gas ($F_{inert1+water}$) Additionally or alternatively, at least a portion of impurity moisture may be removed from the second inert gas flow ($F_{inert2}$) prior to combining the second inert gas flow ($F_{inert2}$) with the first moisturized inert gas ($F_{inert1+water}$).

According to some aspects, removing at least a portion of the impurity moisture may comprise treating the first inert gas flow ($F_{inert1}$) and/or the second inert gas flow ($F_{inert2}$)

with any moisture trap known in the art useful according to the present disclosure, including but not limited to a molecular sieve. According to some aspects, at least 95% of the impurity moisture may be removed from each of the first inert gas flow ($F_{inert1}$) and/or the second inert gas flow ($F_{inert2}$) as described herein.

It should be understood that the concentration of first moisturized inert gas ($F_{inert1+water}$) in the moisturized gas flow ($F_{inert+water}$) is expressed as $F_{inert1+water}/(F_{inert2}+F_{inert1+water})$. According to some aspects, the moisturized gas flow ($F_{inert+water}$) may have a first moisturized inert gas ($F_{inert1+water}$) concentration of between about 1 and 100%, optionally between about 5 and 100%, optionally between about 5 and 75%, optionally between about 5 and 50%, and optionally between about 5 and 10%.

According to some aspects, the concentration of first moisturized inert gas ($F_{inert1+water}$) in the final moisturized gas flow ($F_{inert+water}$) may correspond with a certain acceptable moisture concentration in ppm of the moisturized gas flow ($F_{inert+water}$) as confirmed by a dew point transmitter. For example, in the case wherein the moisturized gas flow ($F_{inert+water}$) is provided by combining a second inert gas flow ($F_{inert2}$) at a volumetric flow rate of 76 sccm with first moisturized inert gas ($F_{inert1+water}$) at a volumetric flow rate of 4 sccm, the concentration of first moisturized inert gas ($F_{inert1+water}$) is 5% in the moisturized gas flow ($F_{inert+water}$). In this example, the moisturized gas flow ($F_{inert+water}$) may have a total acceptable moisture concentration of about 100 ppm as measured by a dew point transmitter.

In another example, in the case wherein the moisturized gas flow ($F_{inert+water}$) is provided by combining a second inert gas flow ($F_{inert2}$) at a volumetric flow rate of 72 sccm with a first moisturized inert gas ($F_{inert1+water}$) at a volumetric flow rate of 8 sccm, the concentration of first moisturized inert gas ($F_{inert1+water}$) is 10% in the moisturized gas flow ($F_{inert+water}$). In this example, the moisturized gas flow ($F_{inert+water}$) may have a total acceptable moisture concentration of about 3000 ppm as measured by a dew point transmitter.

According to some aspects, each of the two or more precursor powders may be subjected to the moisturized gas flow simultaneously or about simultaneously. Alternatively, at least a first portion of the two or more precursor powders may be subjected to the moisturized gas flow upstream of at least a second portion of the two or more precursor powders to provide a vapor atmosphere of the first portion of the two or more precursor powders. As used here, the term "upstream" refers to a position closer to the source of the flow, such as the moisturized gas flow, in relation to a reference position. It should be understood that in some aspects, providing a first portion of the two or more precursor powders upstream of a second portion of the two or more precursor powders may provide an atmosphere at least partially surrounding the second portion of the two or more precursor powders, wherein the atmosphere comprises vapors of the first portion of the two or more precursor powders.

Figure 1B:
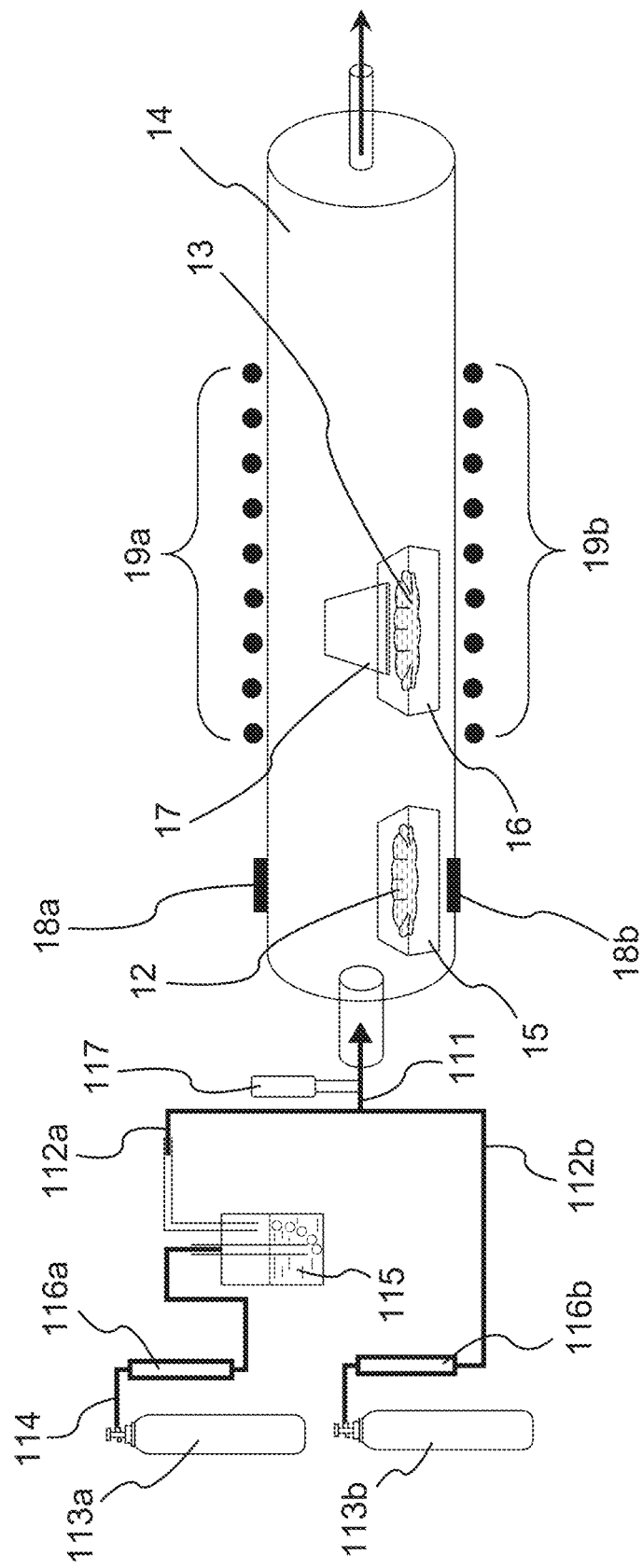
FIG. 1B shows an example schematic of the CVD growth in the method according to the present disclosure.

FIG. 1A shows an example of an inert gas flow 11 wherein a first portion of the two or more precursor powders 12 is provided upstream of a second portion of the two or more precursor powders 13. FIG. 1B shows an example similar to FIG. 1A wherein the inert gas flow is replaced by a moisturized gas flow 111, as described herein. Similar to FIG. 1A, FIG. 1B shows that a first portion of the two or more precursor powders 12 is provided upstream of a second portion of the two or more precursor powders 13.

As shown in FIG. 1B, moisturized gas flow 111 may be provided by combining a first moisturized inert gas 112a with a second inert gas flow 112b, as described herein. First moisturized inert gas 112a may be provided by flowing a first inert gas flow 114 from a first inert gas source 113a through a bubbler 115 containing DI water to provide first moisturized inert gas 112a. As shown in FIG. 1B, at least a portion of impurity moisture may be removed from first inert gas flow 114 by a first moisture trap 116a prior to flowing the first inert gas glow 114 through bubbler 115. As described herein, first moisture trap 116a may be configured to reduce or remove impurity moisture from first inert gas flow 114.

As shown in FIG. 1B, first moisturized inert gas 112a may be combined with second inert gas flow 112b to provide moisturized gas flow 111. Second inert gas flow 112b may be provided by a second inert gas source 113b. Prior to combining first moisturized inert gas 112a and second inert gas flow 112b, at least a portion of impurity moisture may be removed from second inert gas flow 112b by a second moisture trap 116b, as described herein. Similar to first moisture trap 116a, second moisture trap 116b may be configured to reduce or remove impurity moisture from second inert gas flow 112b. According to some aspects, the moisture concentration in ppm of the moisturized gas flow 111 may be measured by a dew point transmitter 117 prior to entering heating apparatus 14, as will be described herein.

According to some aspects, the first portion of the two or more precursor powders 12 may comprise the chalcogen powder as described herein. The first portion of the two or more precursor powders 12 may be provided in a first tray 15. It should be understood that the term "tray" as used herein is not particularly limited, and suitable trays include but are not limited to weigh boats, crucibles, flasks, and other vessels having any shape and/or size that can withstand the temperature excursions of the method disclosed herein.

The second portion of the two or more precursor powders 13 may comprise a precursor powder mixture comprising the metal oxide powder, the metal powder, and the salt powder as described herein. As shown in FIGS. 1A and 1B, the second portion of the two or more precursor powders 13 may be provided in a second tray 16 as described herein and may be proximal to (for example, under, as shown in FIGS. 1A and 1B) a substrate 17 as described herein. However, it should be understood that the method should not be limited to the arrangement shown in FIGS. 1A and 1B. For example, the second portion of the two or more precursor powders 13 shown in FIGS. 1A and 1B may comprise the metal oxide powder and the salt powder as described herein. In this example, at least a surface of the substrate 17 (e.g., at least the surface of the substrate 17 facing the second portion of the two or more precursor powders 13 shown in FIGS. 1A and 1B) may be pre-coated with the metal powder as described herein.

According to some aspects, in the example wherein the precursor powder mixture comprises at least the metal oxide powder and the metal powder as described herein, the precursor powder mixture may have a ratio of precursor powders sufficient to provide double atomic layer ribbons of a TMD material as described herein. For example, the amount of the metal powder and/or the ratio of the metal powder to the metal oxide powder may be selected to provide metal-containing nanoparticles on the substrate as will be described herein. Non-limiting examples of weight ratios of metal oxide powder to metal powder comprised by the precursor powder mixture may be from about 1:0.001 to about 1:1, optionally from about 1:0.02 to 1:0.2.

As shown in FIGS. 1A and 1B, the first portion of the two or more precursor powders 12 and the second portion of the two or more precursor powders 13 may provided in a heating apparatus 14. According to some aspects, the heating apparatus may comprise a quartz tube provided with one or more heating mechanisms. Example heating mechanisms include, but are not limited to, heating wires, heating belts, and any mechanism capable of providing the elevated temperature(s) as describe herein.

For example, FIGS. 1A and 1B show a heating apparatus 14 having a first heating mechanism comprising heating belts 18a, 18b, wherein the first heating mechanism is proximal the first portion of the two or more precursor powders 12. FIGS. 1A and 1B also show a second heating mechanism comprising a plurality of heating wires 19a, 19b proximal the second portion of the two or more precursor powders 13. However, it should be understood that heating apparatus 14 is not necessarily limited to this arrangement. For example, heating belts 18a, 18b and/or heating wires 19a, 19b may be replaced by or supplemented with other heating mechanisms as described herein. According to some aspects, the heating apparatus 14 may be configured such that the first portion of the two or more precursor powders 12 and the second portion of the two or more precursor powders 13 may be independently heated, that is, such that the first portion of the two or more precursor powders 12 and the second portion of the two or more precursor powders 13 are heated to different temperatures. It should also be understood that while FIGS. 1A and 1B show heating mechanisms provided above and below the first portion of the two or more precursor powders 12 and the second portion of the two or more precursor powders 13, the heating mechanism(s) may be provided in any position relative to the first portion of the two or more precursor powders 12 and the second portion of the two or more precursor powders 13 sufficient to provide the elevated temperature(s) as described herein.

The method may comprise heating the first portion of the two or more precursor powders 12 to a first elevated temperature sufficient to provide a vapor of the first portion of the two or more precursor powders 12 as described herein. For example, in the case where the first portion of the two or more precursor powders comprises the chalcogen powder, the method may comprise heating the chalcogen powder to a first temperature sufficient to provide a chalcogen vapor atmosphere. According to some aspects, the first temperature may be between about 100° C. and 300° C., and optionally about 200° C.

According to some aspects, the vapor may be provided proximal to the second portion of the two or more precursor powders 13. For example, as shown in FIGS. 1A and 1B, inert gas flow 11 or moisturized gas flow 111, respectively, may drive the vapor such that it provides an atmosphere at least partially surrounding the second portion of two or more precursor powders 13.

The method may comprise heating the second portion of two or more precursor powders 13 in the presence of the vapor atmosphere to a second elevated temperature sufficient to deposit double atomic layer ribbons of a TMD material on a substrate via chemical vapor deposition. For example, as described herein, the second portion of the two or more precursor powders 13 may comprise a precursor powder mixture comprising the metal oxide powder, the metal powder, and the salt powder as described herein. The method may comprise heating the second portion of the precursor powder mixture in the presence of the chalcogen vapor atmosphere as described herein to a second elevated temperature sufficient to vaporize the second portion of the precursor powder mixture. In this way, double atomic layer ribbons of a TMD material may be deposited on a substrate provided proximal to the second portion of the precursor powder mixture. According to some aspects, the second temperature may be between about 600° C. and 1000° C., optionally between about between about 700° C. and 900° C., and optionally between about 770° C. and 850° C.

Figure 2A:
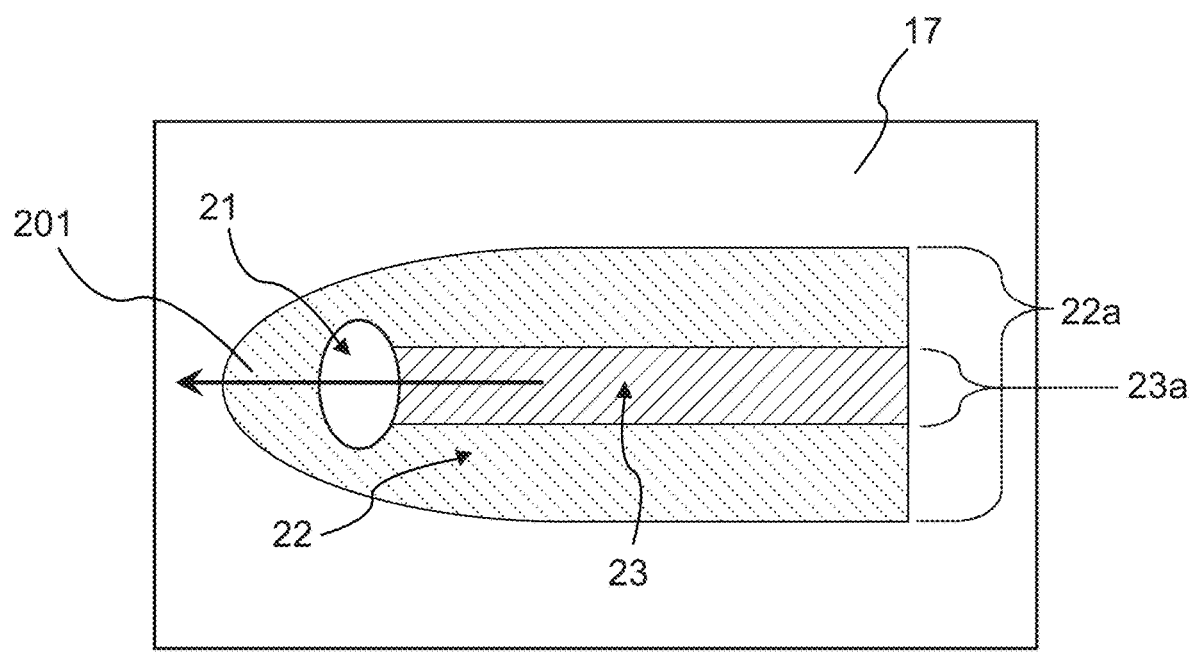
FIG. 2A shows an example double atomic layer ribbon according to aspects of the present disclosure.

FIG. 2A shows an example double atomic layer ribbon as described herein. As shown in FIG. 2A, the double atomic layer ribbon may comprise a first monolayer 22 comprising a TMD material as described herein. The double atomic layer ribbon may further comprise a second monolayer 23 comprising the TMD material, wherein the second monolayer 23 is positioned on a surface of the first monolayer 22. The deposition of the double atomic layer ribbon may be at least partially guided by motion 201 of a metal-containing nanoparticle 21 along the surface of the substrate 17. According to some aspects, the metal-containing nanoparticle may have a size on the nanoscale, for example, a particle size of between about 1 and 100 nm. It should be understood that the metal-containing nanoparticle 21 may comprise one or more elements provided by the two or more precursor powders as described herein. For example, the metal-containing nanoparticle 21 may comprise a metal from the metal powder, a metal from the metal oxide powder, and/or a chalcogen from the chalcogen powder. In one non-limiting example, the metal-containing nanoparticle may comprise a Ni—Mo—S nanoparticle or an Fe—Mo—S nanoparticle. In another non-limiting example, the metal-containing nanoparticles may comprise a Ni nanoparticle or an Fe nanoparticle.

According to some aspects, the metal-containing nanoparticle may have a certain element ratio. In one example, the metal-containing nanoparticle may have a ratio of metal to chalcogen of from about 0.1:1 to about 2:1, optionally from about 0.5:1 to about 2:1, and optionally from about 0.67:1 to about 1.5:1. It should be understood that the ratio of metal to chalcogen may be the ratio of metal from the metal powder to chalcogen (e.g., the ratio of Ni to S), the ratio of metal from the metal oxide powder to chalcogen (e.g., the ratio of Mo to S), or the ratio of total metal to chalcogen (the ratio of (Ni+Mo) to S).

In another example, the metal-containing nanoparticle may have a first metal to second metal ratio of from about 0.1:1 to about 2:1, optionally from about 0.5:1 to about 1.5:1. In one non-limiting example, the first metal may comprise the metal from the metal powder (e.g., Ni) and the second metal may comprise the metal from the metal oxide powder (e.g., Mo).

In another example, the metal-containing nanoparticle may have only the metal from the metal powder.

As shown in FIG. 2A, the first monolayer 22 may have a first average width 22a and the second monolayer 23 may have a second average width 23a. It should be understood that the particle size of the metal-containing nanoparticle 21 may correspond with at least the second average width 23a, and in particular, the particle size of the metal-containing nanoparticle 21 may be slightly larger than the second average width 23a. It should be understood that increasing the particle size of the metal-containing nanoparticle 21 may thus increase the second average width 23a, whereas decreasing the particle size of the metal-containing nanoparticle 21 may decrease the second average width 23a.

According to some aspects, the first average width may be between about 0.1 and about 100 μm, and optionally between about 1 and 10 μm. According to some aspects, the second average width may be between about 0.5 and 1000 nm, and optionally between about 5 and 100 nm. According to some aspects, the second average width may be about 10 nm, optionally about 20 nm, optionally about 30 nm, optionally about 40 nm, optionally about 50 nm, optionally about 60 nm, optionally about 70 nm, optionally about 80 nm, optionally about 90 nm, and optionally about 100 nm. According to some aspects, the double atomic layer ribbon may have a length of between about 1 and 1000 μm, and optionally between about 50 and 500 μm.

Figure 2B:
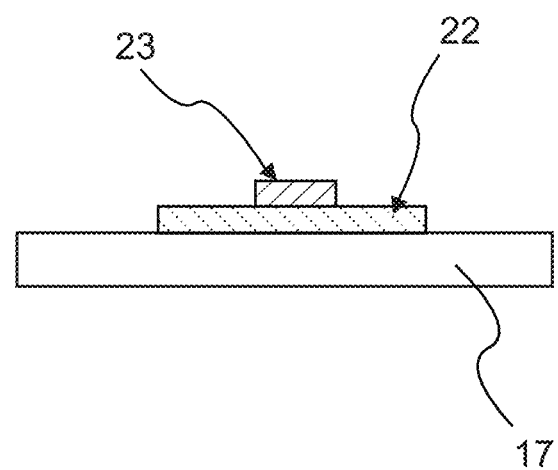
FIG. 2B shows an example cross-sectional view of the double atomic layer ribbon of FIG. 2A.

FIG. 2B shows an example cross-sectional view of the double atomic layer ribbon of FIG. 2A, including a substrate 17, a first monolayer 22, and a second monolayer 23 positioned on a surface of the first monolayer 22.

The method may further comprise removing a portion of the double atomic layer ribbon to provide an atomic layer nanoribbon of a TMD material as described herein. According to some aspects, removing a portion of the double atomic layer ribbon may comprise oxidizing the portion of the double atomic layer ribbon to provide an oxidized portion, and separating the oxidized portion from an un-oxidized portion to provide an atomic layer nanoribbon of a TMD material.

Figure 3A:
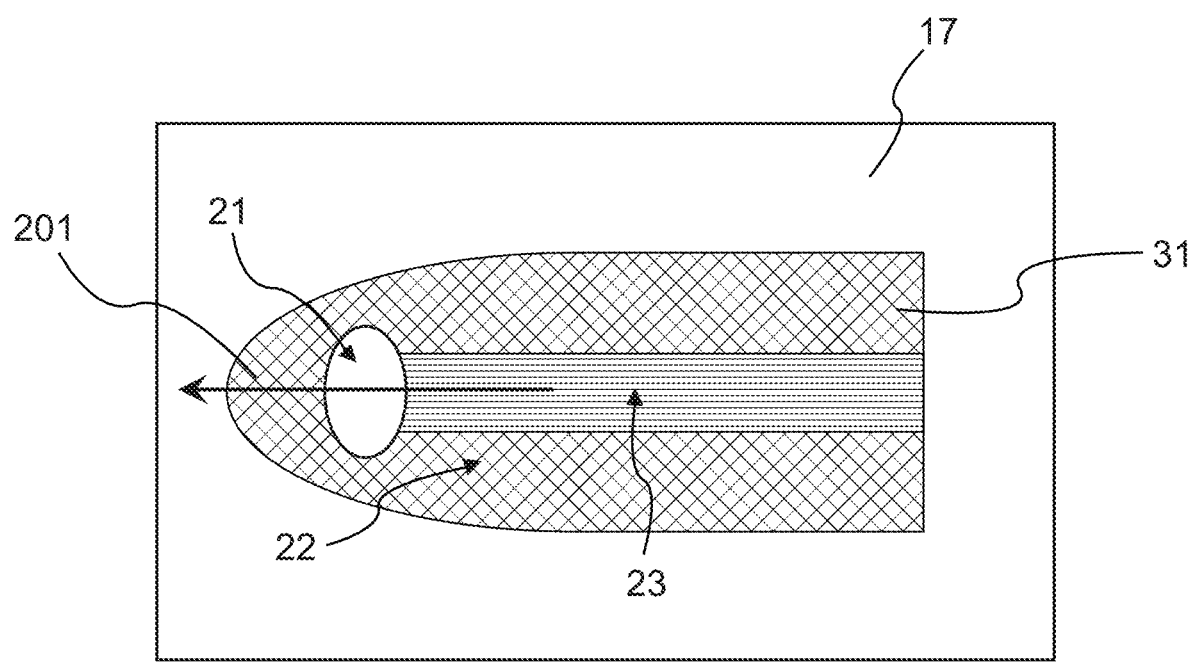
FIG. 3A shows an example double atomic layer ribbon according to aspects of the present disclosure.
Figure 3B:
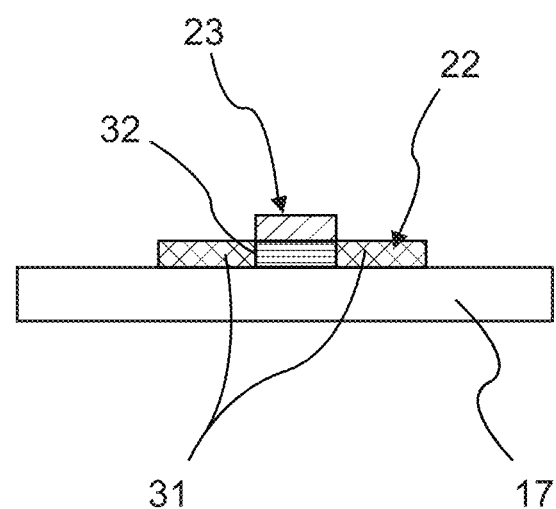
FIG. 3B shows an example cross-sectional view of the double atomic layer ribbon of FIG. 3A.

For example, FIG. 3A shows a double atomic layer ribbon as described in relation to FIG. 2A, including a first monolayer 22, a second monolayer 23, and a metal-containing nanoparticle 21. FIG. 3B shows a cross-sectional view of the example shown in FIG. 3A. As shown in FIGS. 3A and 3B, the first monolayer 22 comprises an unexposed portion 32 (i.e., the portion of the first monolayer 22 having the second monolayer 23 thereon) and an exposed portion 31 (i.e., the portion of the first monolayer 22 that does not have the second monolayer 23 thereon). According to some aspects, the method may comprise oxidizing the TMD material comprised by the exposed portion 31 of the first monolayer 22 to provide an oxidized portion, wherein the oxidized portion comprises a metal oxide material.

In some non-limiting examples, in the case wherein the TMD material comprised by the double atomic layer ribbon is $MoS_2$ or $MoSe_2$, the method may comprise oxidizing the $MoS_2$ or $MoSe_2$ of exposed portion 31 such that it is converted to $MoO_3$. In another non-limiting example, in the case wherein the TMD material comprised by the double atomic layer ribbon is $WS_2$ or $WSe_2$, the method may comprise oxidizing the $WS_2$ or $WSe_2$ of exposed portion 31 such that it is converted to $WO_3$. It should be understood that in the context of the present disclosure, oxidizing exposed portion 31 may convert exposed portion 31 to the oxidized portion as described herein.

According to some aspects, oxidizing a portion of the double atomic layer ribbon to provide an oxidized portion as described herein may comprise subjecting the double atomic layer ribbon to a UV-ozone (UVO) treatment. In some non-limiting examples, the UVO treatment may comprise providing the double atomic layer ribbon in a UVO-cleaner having a UV light. In one example, a substrate having the double atomic layer ribbon deposited thereon (for example, by a CVD process as described herein) may be provided in a UVO-cleaner at a certain distance from the UV light such that a UVO intensity is provided to the double atomic layer ribbon sufficient to oxidize the exposed portion as described herein. According to some aspects, the distance between the UV light and the double atomic layer ribbon may be between about 0.1 and 5 cm, and optionally between about 0.5 and 3.2 cm. According to some aspects, the UVO treatment may be conducted at a temperature of between about 20° C. and about 200° C. for a time of between about one minute and two hours, and optionally for a time of between about five minutes and one hour. According to some aspects, the time may be selected to oxidize at least 80% of the TMD material of the exposed portion 31, optionally at least about 85%, optionally at least about 90%, optionally at least about 95%, optionally at least about 97%, optionally at least about 98%, optionally at least about 99%, and optionally about 100%.

The method may further comprise etching the oxidized portion of the double atomic layer ribbon to provide an atomic layer nanoribbon of a TMD material. As used herein, the term "etching" refers to a subtractive manufacturing process wherein an etching agent is used to remove one or more substances from a surface. According to some aspects of the present disclosure, etching the oxidized portion of the double atomic layer ribbon may comprise subjecting the double atomic layer ribbon to an etching treatment sufficient to separate the oxidized portion of the double atomic layer ribbon from remaining portions (e.g., un-oxidized portions) thereof. The method may further comprise a rinsing step to remove residue etching agent.

According to some aspects, the etching agent may comprise a hydroxide, such as potassium hydroxide (KOH), sodium hydroxide (NaOH), or a combination thereof. The etching agent may be provided as a solution, for example, an aqueous solution. According to some aspects, the etching agent may have a hydroxide concentration of between about 0.1 and 10 M, optionally between about 0.5 and 5 M, and optionally about 1 M. In one non-limiting example, the etching treatment may comprise soaking the double atomic layer ribbon having at least one oxidized portion in a hydroxide solution for a time sufficient to remove the oxidized portion. The time may be, for example, between about one second and one minute, optionally between about one second and thirty seconds, and optionally about ten seconds. In this example, rinsing with water may be performed to remove residue etching agent.

Figure 4A:
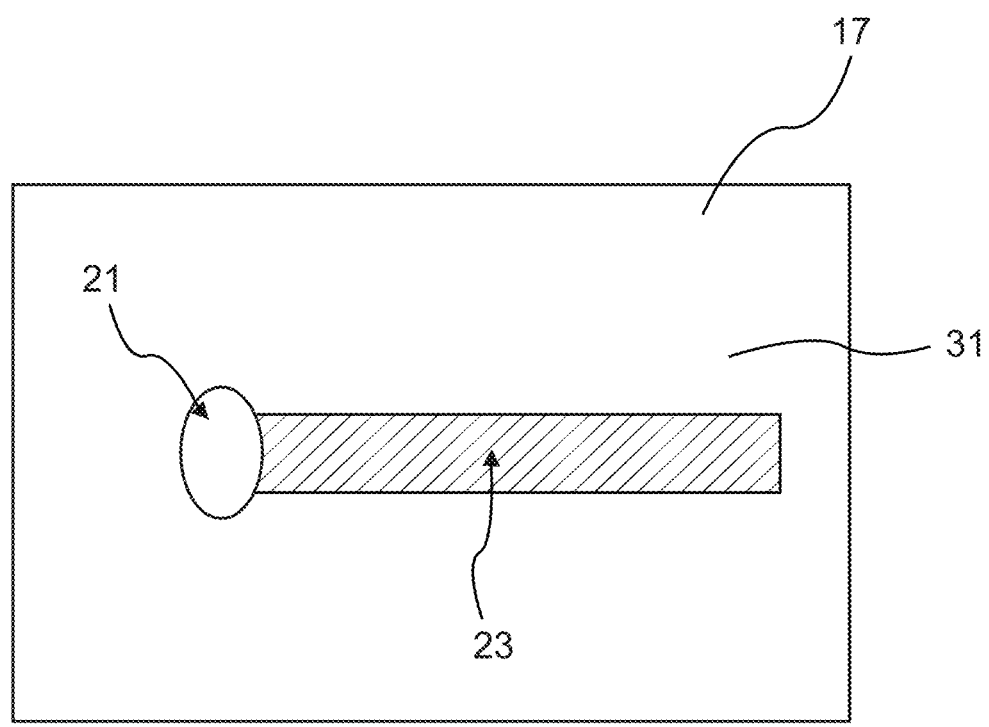
FIG. 4A shows an example double atomic layer nanoribbon of a TMD material according to aspects of the present disclosure.
Figure 4B:
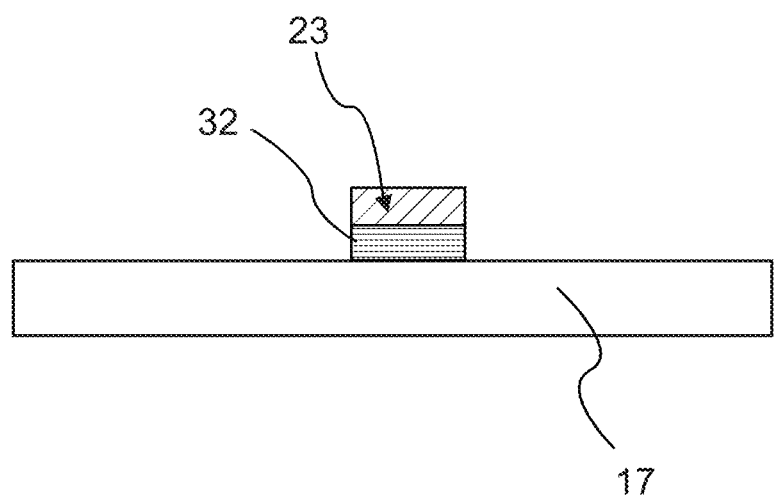
FIG. 4B shows an example cross-sectional view of the double atomic layer nanoribbon of FIG. 4A.

FIG. 4A shows an example double atomic layer nanoribbon of a TMD material prepared according to the present method. It should be understood that the double atomic layer nanoribbon shown in FIG. 4A may correspond with the double atomic layer ribbon of FIG. 3A wherein the exposed portion 31 has been removed as described herein. FIG. 4B shows a cross-sectional view of the double atomic layer nanoribbon of a TMD material of FIG. 4A. It should be understood that the example double atomic layer nanoribbon shown in FIGS. 4A and 4B comprises the unexposed portion 32 of the first monolayer 22 and the second monolayer 23 of the double atomic layer ribbon shown in, for example, FIG. 3A.

Figure 5A:
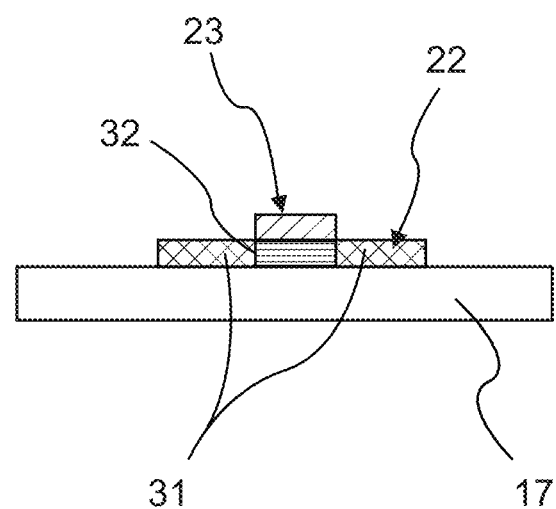
FIG. 5A shows an example cross-sectional view of a double atomic layer ribbon according to aspects of the present disclosure.
Figure 5B:
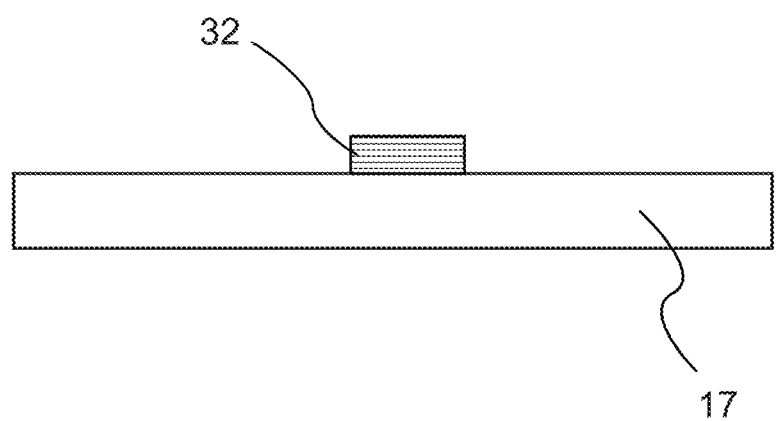
FIG. 5B shows an example cross-sectional view of a single atomic layer nanoribbon according to aspects of the present disclosure.

It should be understood that the examples shown in FIGS. 3-4 should not necessarily limit the present disclosure. For example, as shown in FIG. 5A, the method may comprise oxidizing both the TMD material comprised by the exposed portion 31 of the first monolayer 22 and the TMD material comprised by the second monolayer 23. In this example, the exposed portion 31 of the first monolayer 22 and the second monolayer 23 may be collectively referred to as an "exposed portion," as described herein. Upon oxidation of the TMD material comprised by the exposed portion, the oxidized material comprised by the exposed portion may be collectively referred to as an "oxidized portion," as described herein. The method may comprise removing the oxidized portion as described herein to provide a single atomic layer nanoribbon as shown in FIG. 5B. It should be understood that the single atomic layer nanoribbon shown in FIG. 5B comprises the unexposed portion 32 of first monolayer 22 as shown in FIG. 5A.

The present disclosure is also directed to double atomic layer ribbons provided by the method described herein. According to some aspects, the double atomic layer ribbon may comprise a first monolayer comprising a TMD material as described herein, and a second monolayer comprising the TMD material, wherein the second monolayer is positioned on a surface of the first monolayer. According to some aspects, the first monolayer may have an average width that is greater than the average width of the second monolayer.

The present disclosure is also directed to double atomic layer nanoribbons and single atomic layer nanoribbons provided by the method described herein.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Thus, the claims are not intended to be limited to the aspects shown herein, but are to be accorded the full scope consistent with the language of the claims, where reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Nothing disclosed herein is intended to be dedicated to the public regardless of whether such disclosure is explicitly recited in the claims.

The word "about" is used herein to mean within ±5% of the stated value, optionally within ±4%, optionally within ±3%, optionally within ±2%, optionally within ±1%, optionally within ±0.5%, optionally within ±0.1%, and optionally within ±0.01%.

The following examples are put forth so as to provide those of ordinary skill in the art with a complete disclosure and description of how to make and use the present invention, and are not intended to limit the scope of what the inventors regard as their invention nor are they intended to represent that the experiments described below are all or the only experiments performed. Efforts have been made to ensure accuracy with respect to numbers used (e.g. amounts, dimensions, etc.) but some experimental errors and deviations should be accounted for.

EXAMPLES

Example I: Preparation of Double Atomic Layer Ribbon

Double atomic layer $MoS_2$ ribbons were synthesized via a CVD method conducted in a tube furnace system equipped with a 1" quartz tube. The growth substrate, an Si with 285 nm $SiO_2$ ($SiO_2$/Si plate, was cleaned by acetone and isopropanol (IPA) and then placed face-down above an alumina crucible containing a mixture of about 1.2 mg $MoO_2$, about 0.05 mg NaBr, and about 0.1 mg Ni powders, which was then inserted into the center of the quartz tube. Another crucible containing about 200 mg S powder was located at the upstream side of the tube, where a heating belt was wrapped. The reaction chamber was first purged with a 500 sccm (standard cubic centimeter per minute) argon gas flow for one hour. Then, the reaction was conducted at 770° C. (with a ramping rate of 40° C./min) for three minutes with a total 80 sccm of moisturized argon gas flow containing 10% of $F_{inert+water}$. At the reaction temperature, the temperature at the location of S powder was about 200° C. as controlled by the heating belt. After growth, the heating belt was removed and the furnace was cooled down naturally to room temperature.

Figure 6A:
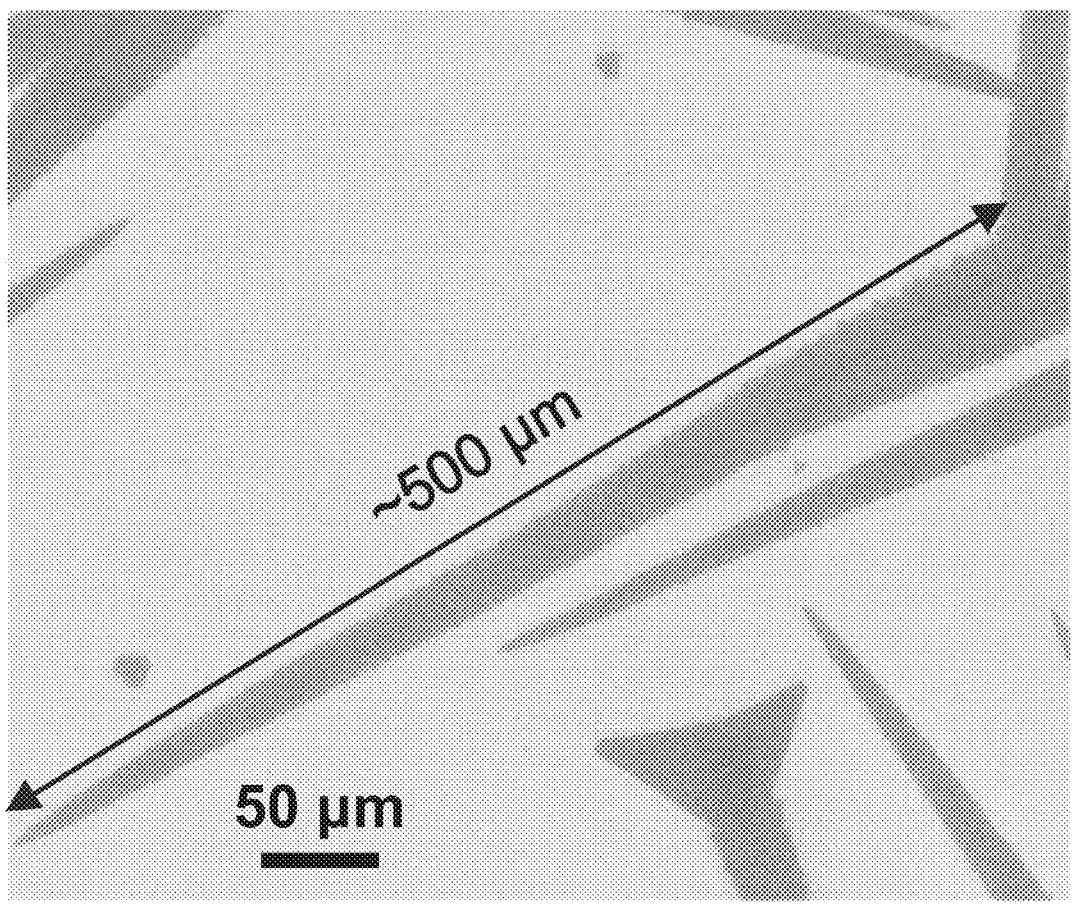
FIG. 6A shows a scanning electron microscopy (SEM) image of the double atomic layer ribbon prepared according to Example I.

Example II(a): Scanning Electron Microscopy Characterization of Double Atomic Layer Ribbon FIG. 6A shows a scanning electrode microscopy (SEM) image the double atomic layer ribbon prepared according to Example I.

Figure 6B:
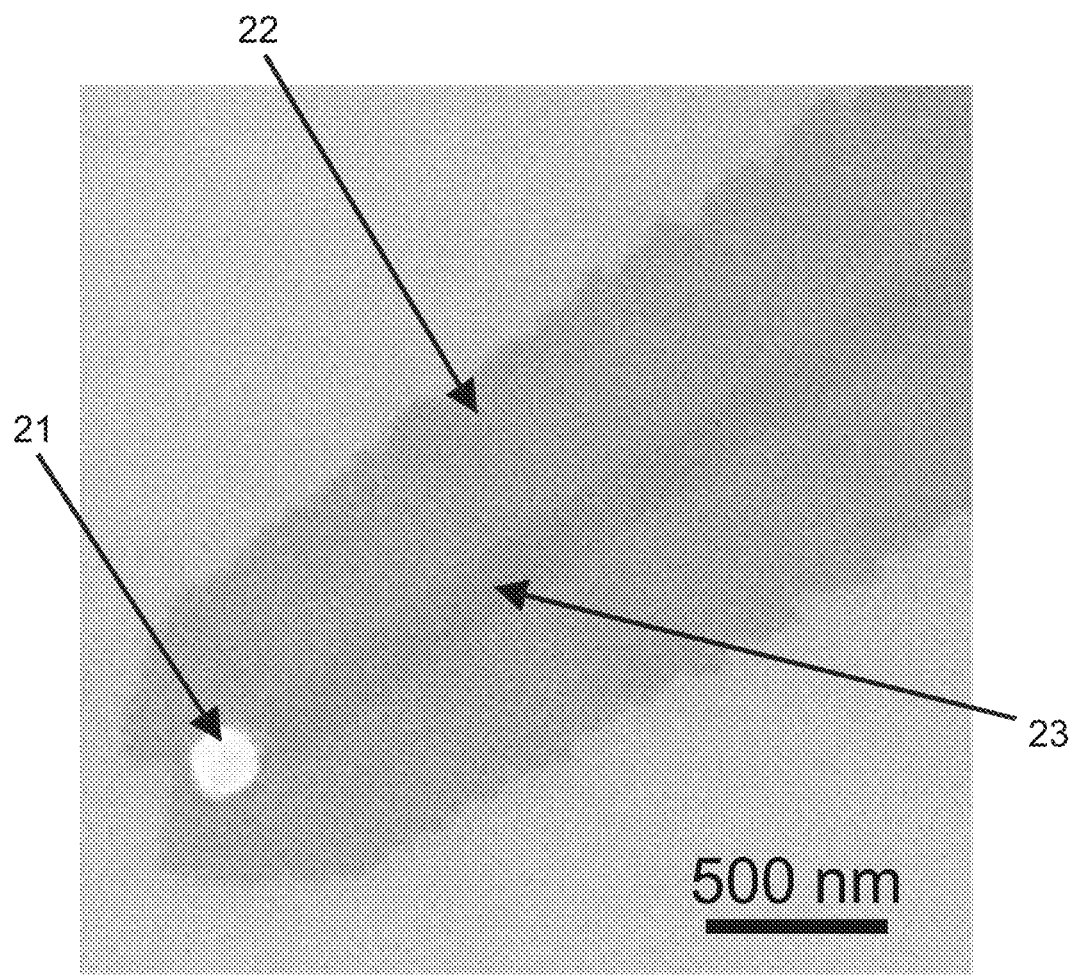
FIG. 6B shows an SEM image of the double atomic layer ribbon prepared according to Example I.

FIG. 6B shows another SEM image of the double atomic layer ribbon prepared according to Example I, including a first monolayer 22 comprising $MoS_2$, a second monolayer 23 comprising $MoS_2$, and a Ni—Mo—S nanoparticle 21. As shown in FIG. 6B, the first monolayer 22 had a width of about 1 μm, and the second monolayer 23 had a width of about 80 nm. The second monolayer 23 was terminated by a Ni—Mo—S nanoparticle 21, which had a diameter comparable to the width of the second monolayer 23.

Figure 7A:
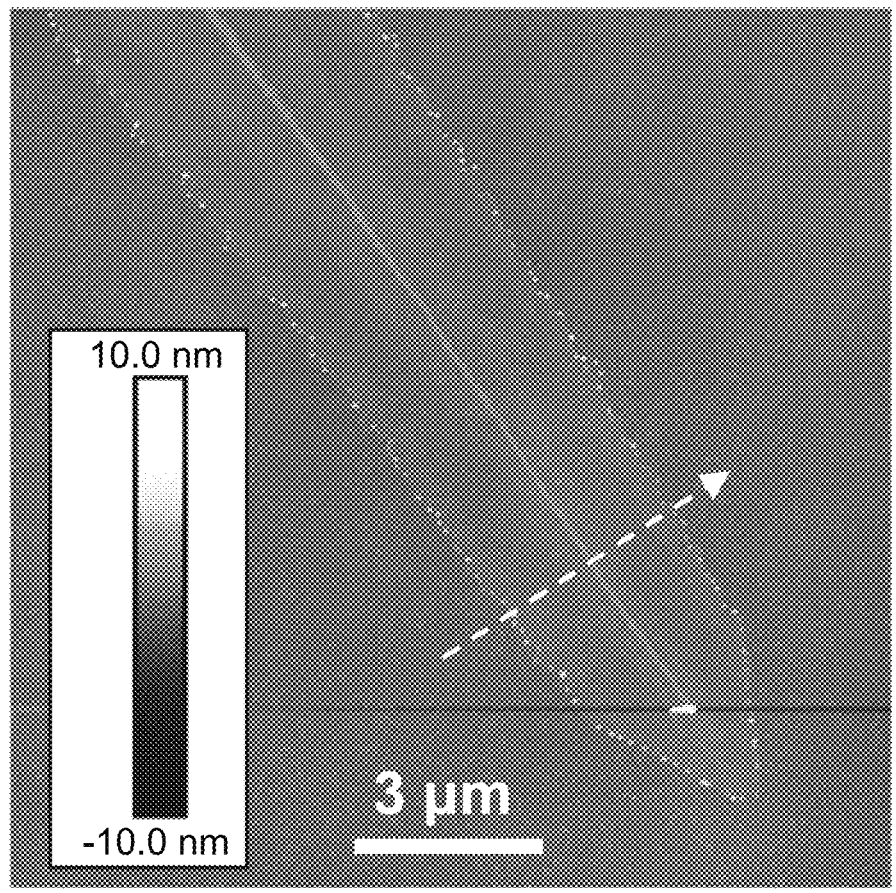
FIG. 7A shows an atomic force microscopy (AFM) image of the double atomic layer ribbon prepared according to Example I.
Figure 7B:
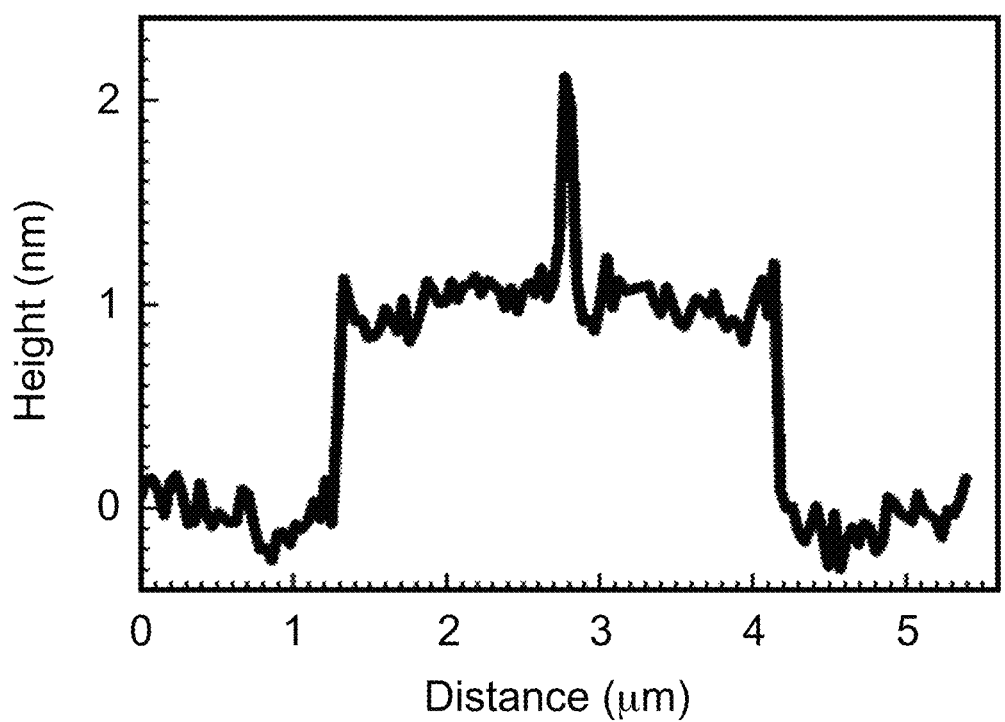
FIG. 7B shows the height profile along the dashed arrow of FIG. 7A.

Example II(b): Atomic Force Microscopy Characterization of Double Atomic Layer Ribbon FIG. 7A shows an atomic force microscopy (AFM) image of the double atomic layer ribbon prepared according to Example I with topological information. FIG. 7B shows the height profile along the dashed arrow of FIG. 7A. The height profile confirmed that the double atomic layer ribbon comprised a first monolayer having a thickness of about 1 nm and a second monolayer on a surface of the first monolayer and having a thickness of about 1 nm.

Example III: Preparation of Double Atomic Layer Nanoribbon

The as-grown double atomic layer $MoS_2$ ribbons prepared according to Example I were first treated in a UVO cleaner at 20° C. for five to ten minutes. The distance between the ribbons and UV light was about 2 cm. The sample was then subjected to an etching treatment that consisted of soaking the sample in a 1 M KOH aqueous solution for ten seconds and subsequently rinsing by deionized water for ten seconds.

Example IV: Scanning Electron Microscopy Characterization of Double Atomic Layer Ribbon after UVO FIGS. 8A and 8B show SEM images of the double atomic layer ribbon at different points of the UVO treatment as described in Example III.

Figure 8A:
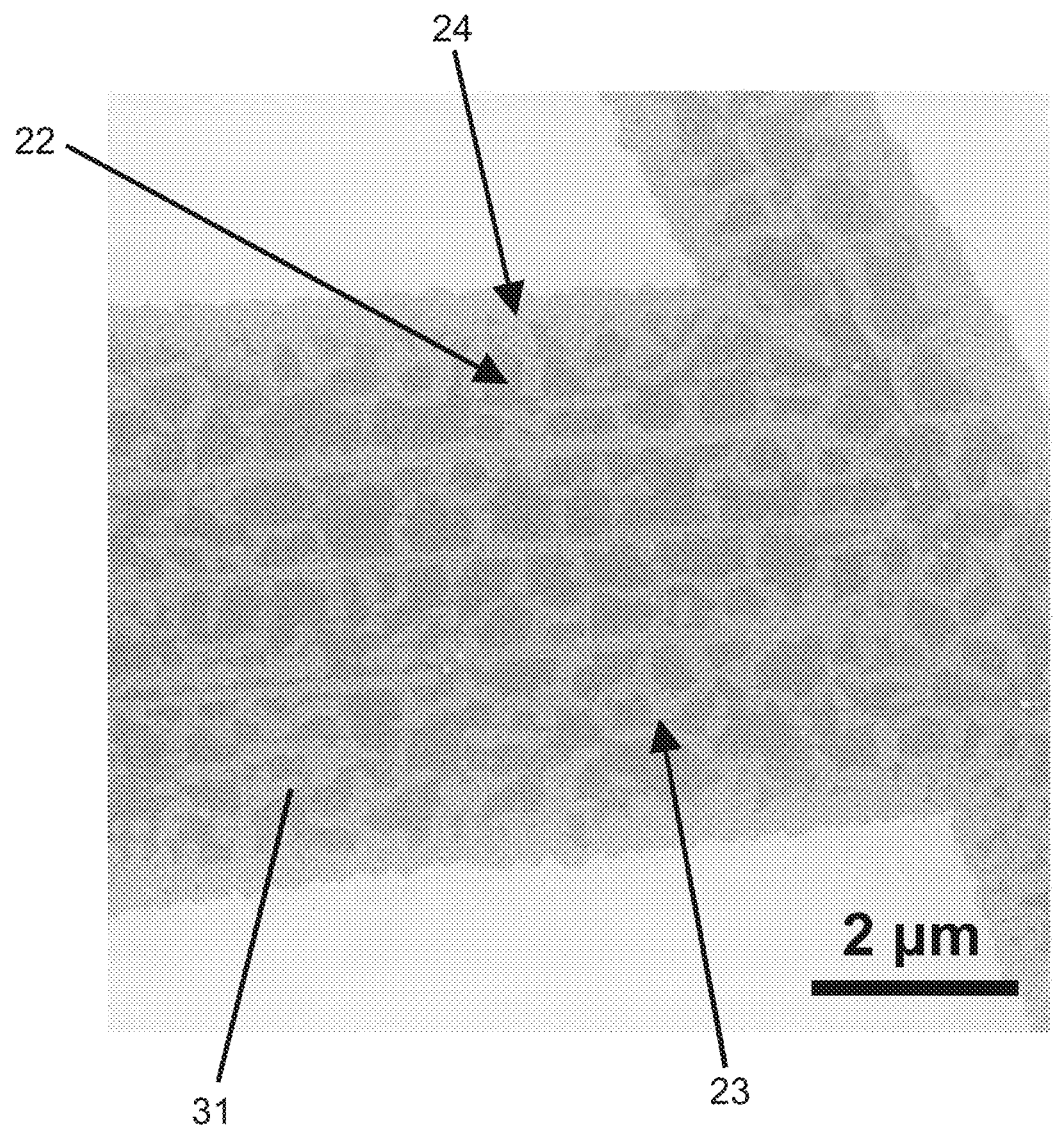
FIG. 8A shows an SEM image of the double atomic layer ribbon after five minutes of the UVO treatment described in Example III.

In particular, FIG. 8A shows an SEM image of the double atomic layer ribbon after five minutes of the UVO treatment. As seen in FIG. 8A, the double atomic layer ribbon comprised a first monolayer 22 and a second monolayer 23 each comprising $MoS_2$. FIG. 8A also shows that the exposed portion 31 of the first monolayer 22 was partially converted to $MoO_3$ 24 (light contrast).

Figure 8B:
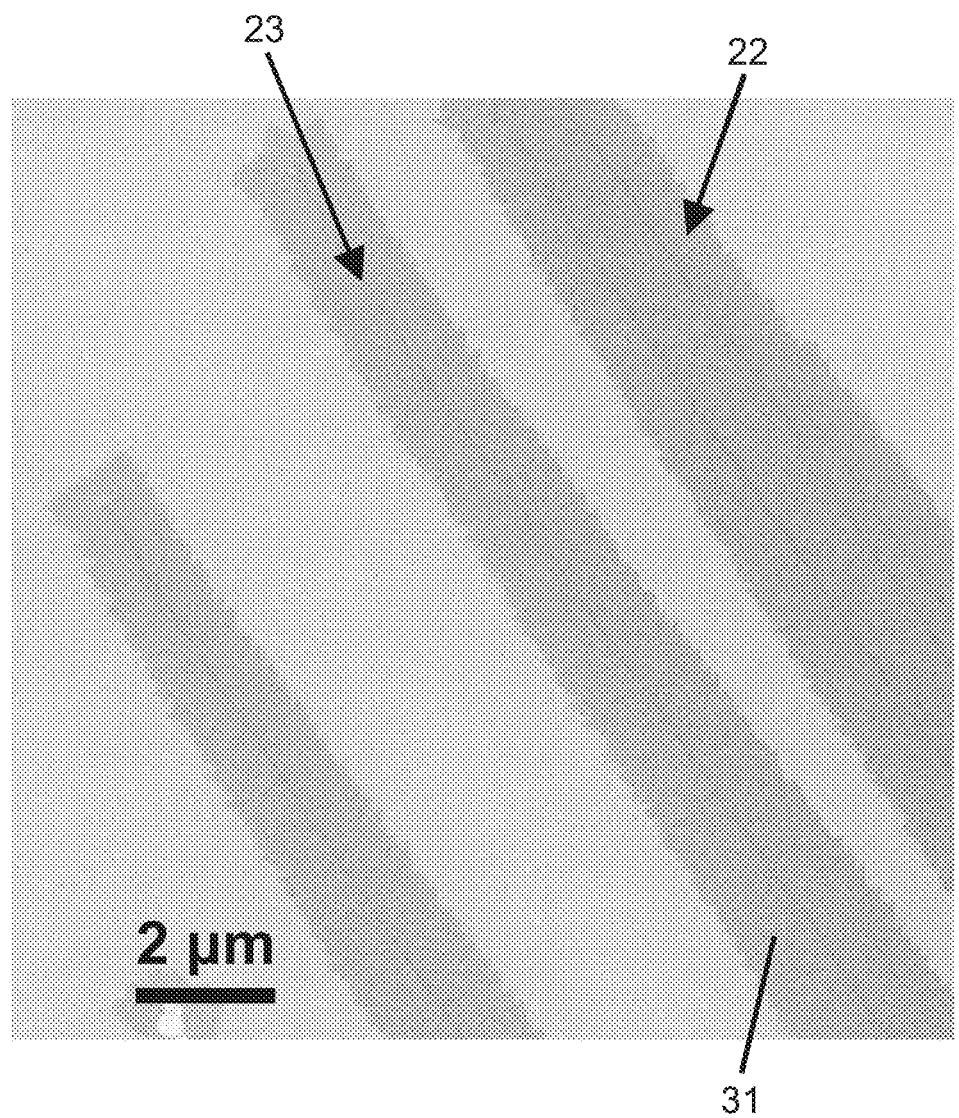
FIG. 8B shows an SEM image of the double atomic layer ribbon after eight minutes of the UVO treatment described in Example III.

FIG. 8B shows an SEM image of the double atomic layer ribbon after eight minutes of the UVO treatment. As seen in FIG. 8B, the double atomic layer ribbon comprised a first monolayer 22 and a second monolayer 23, wherein the second monolayer 23 comprised $MoS_2$. As shown in FIG. 8B, the exposed portion 31 of the first monolayer 22 was completely converted to $MoO_3$ (light contrast).

Figure 9A:
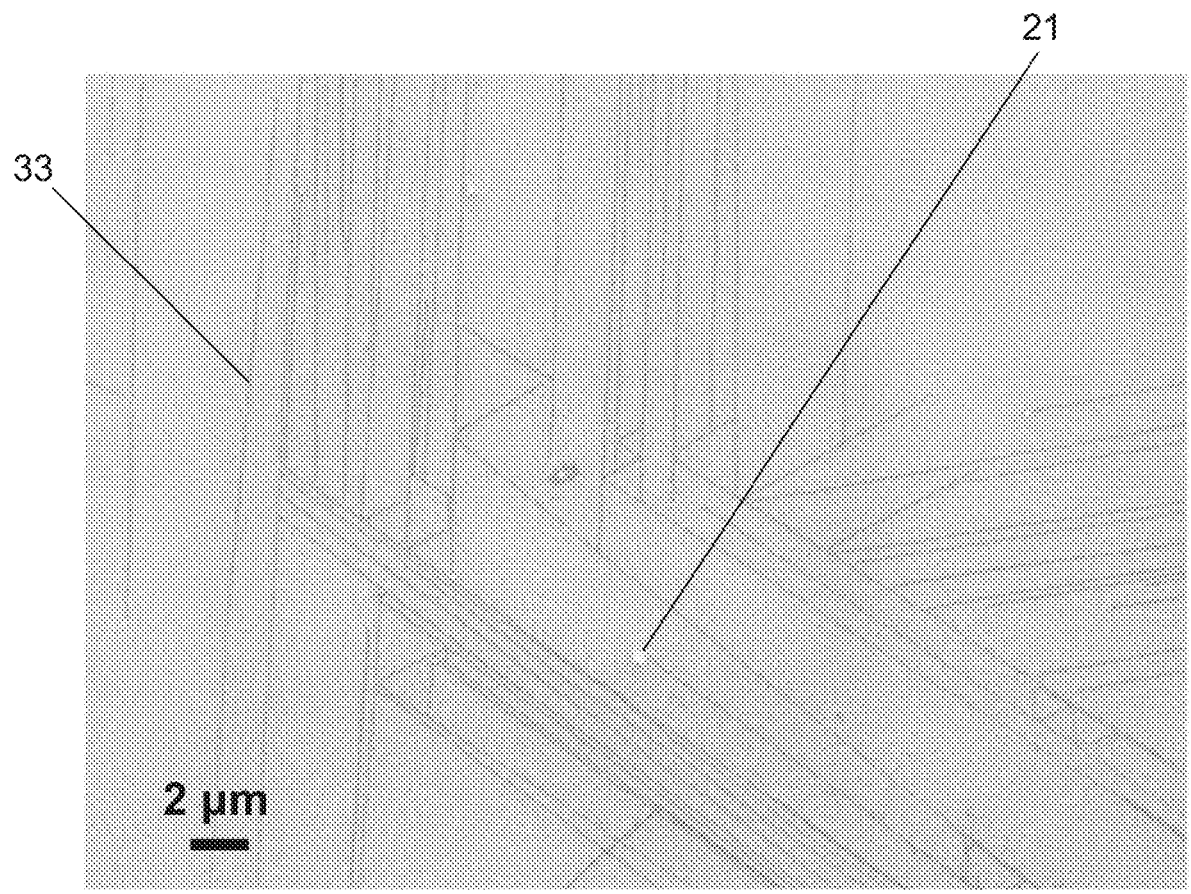
FIG. 9A shows an SEM image of the example double atomic layer nanoribbon after the etching treatment described in Example III.

Example V(a): Scanning Electron Microscopy Characterization of Double Atomic Layer Nanoribbon FIG. 9A shows an SEM image of the double atomic layer nanoribbon after the etching treatment as described in Example III. FIG. 9A shows a Ni—Mo—S nanoparticle 21 and a second monolayer 23 comprising $MoS_2$ provided on a surface of the unexposed portion of the first monolayer (not visible).

Figure 9B:
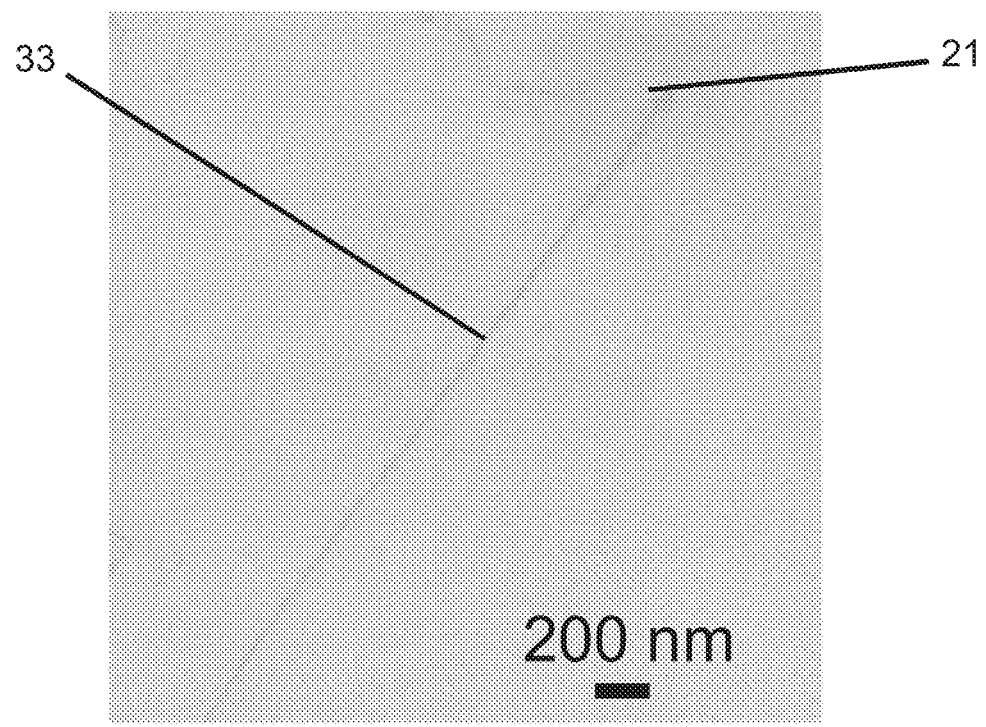
FIG. 9B shows an SEM image of the double atomic layer nanoribbon after the etching treatment described in Example III.

FIG. 9B shows another SEM image of the double atomic layer nanoribbon after the etching treatment as described in Example III. FIG. 9B shows a Ni—Mo—S nanoparticle 21 and a second monolayer 23 comprising $MoS_2$ provided on a surface of the unexposed portion of a first monolayer (not visible). The double atomic layer nanoribbon had a width of about 10 nm.

Figure 9C:
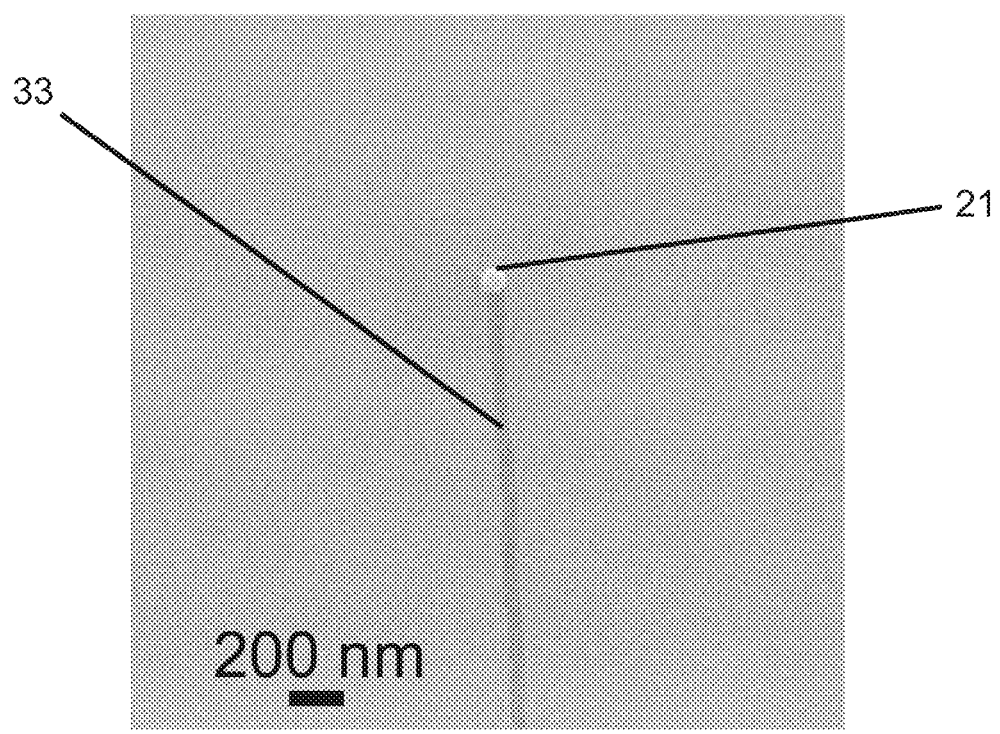
FIG. 9C shows an SEM image of the double atomic layer nanoribbon after the etching treatment described in Example III.

FIG. 9C shows another SEM image of the double atomic layer nanoribbon after the etching treatment as described in Example III. FIG. 9C shows a Ni—Mo—S nanoparticle 21 and a second monolayer 23 comprising $MoS_2$ provided on a surface of the unexposed portion of a first monolayer (not visible). The double atomic layer nanoribbon had a width of about 20 nm.

Figure 9D:
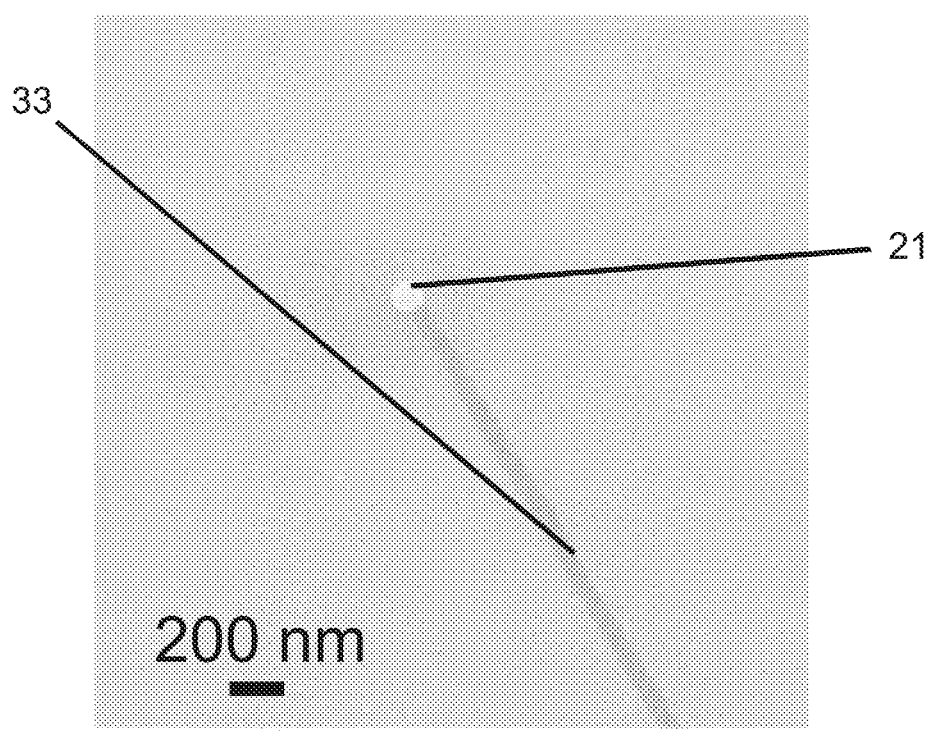
FIG. 9D shows an SEM image of the double atomic layer nanoribbon after the etching treatment described in Example III.

FIG. 9D shows another SEM image of the double atomic layer nanoribbon after the etching treatment as described in Example III. FIG. 9D shows a Ni—Mo—S nanoparticle 21 and a second monolayer 23 comprising $MoS_2$ provided on a surface of the unexposed portion of a first monolayer (not visible). The double atomic layer nanoribbon had a width of about 50 nm.

Figure 10A:
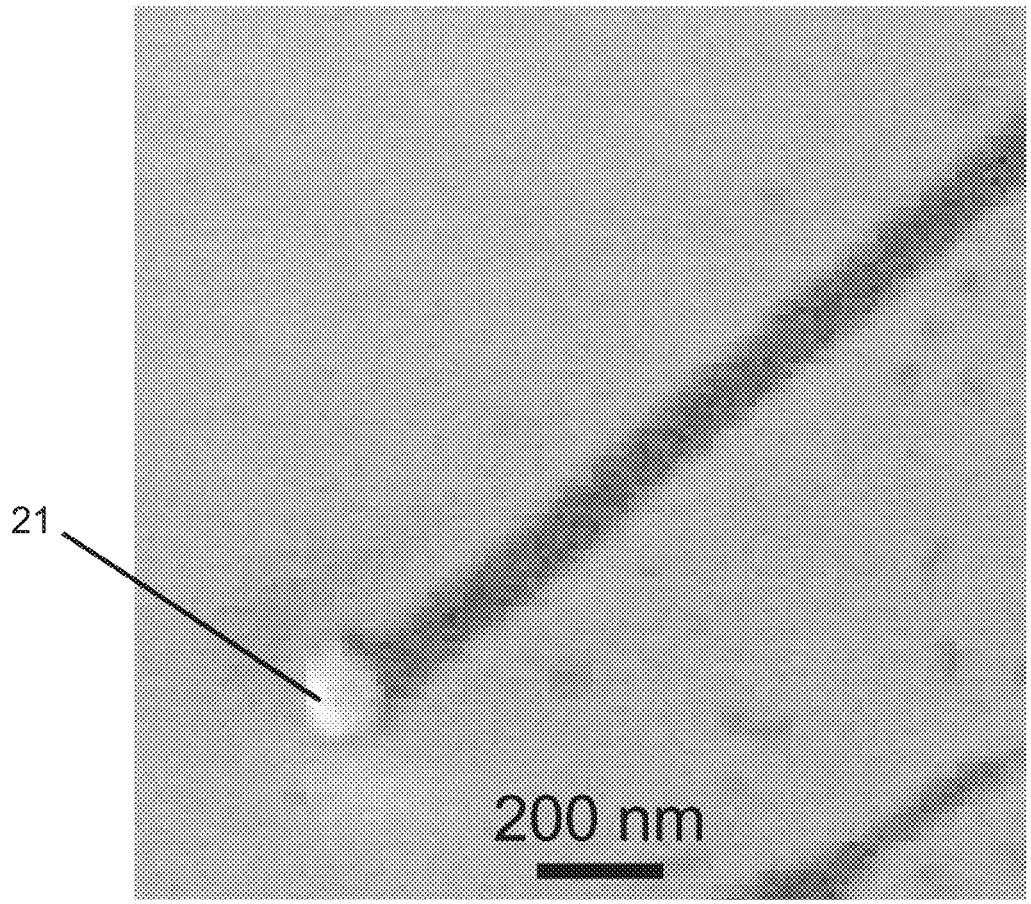
FIG. 10A shows an SEM image of the double atomic layer nanoribbon prepared according to Example III.

Example V(b): Auger Electron Spectroscopy characterization of Double Atomic Layer Nanoribbon FIG. 10A shows an electron microscopy image of the double atomic layer nanoribbon prepared according to Example III. As shown in FIG. 10A, the double atomic layer nanoribbon was terminated with a metal-containing nanoparticle 21.

Figure 10B:
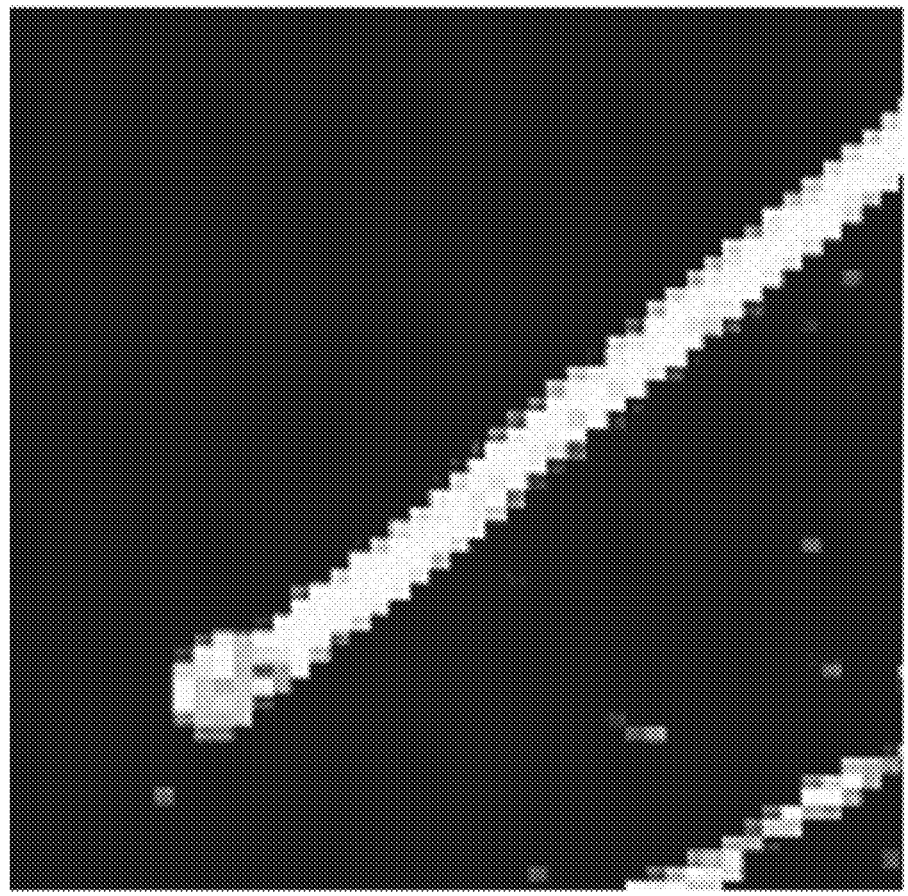
FIG. 10B shows Auger electron spectroscopy (AES) element distribution mapping of S in the double atomic layer nanoribbon shown in FIG. 10A prepared according to Example III.
Figure 10C:
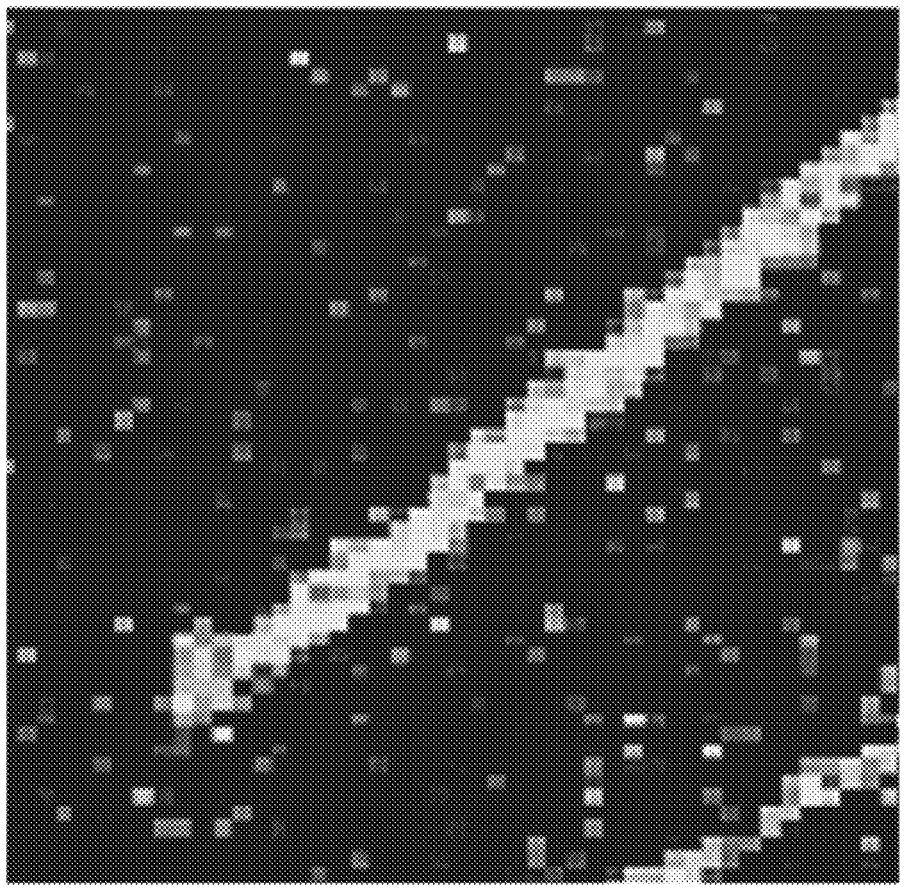
FIG. 10C shows AES element distribution mapping of Mo in the double atomic layer nanoribbon shown in FIG. 10A prepared according to Example III.
Figure 10D:
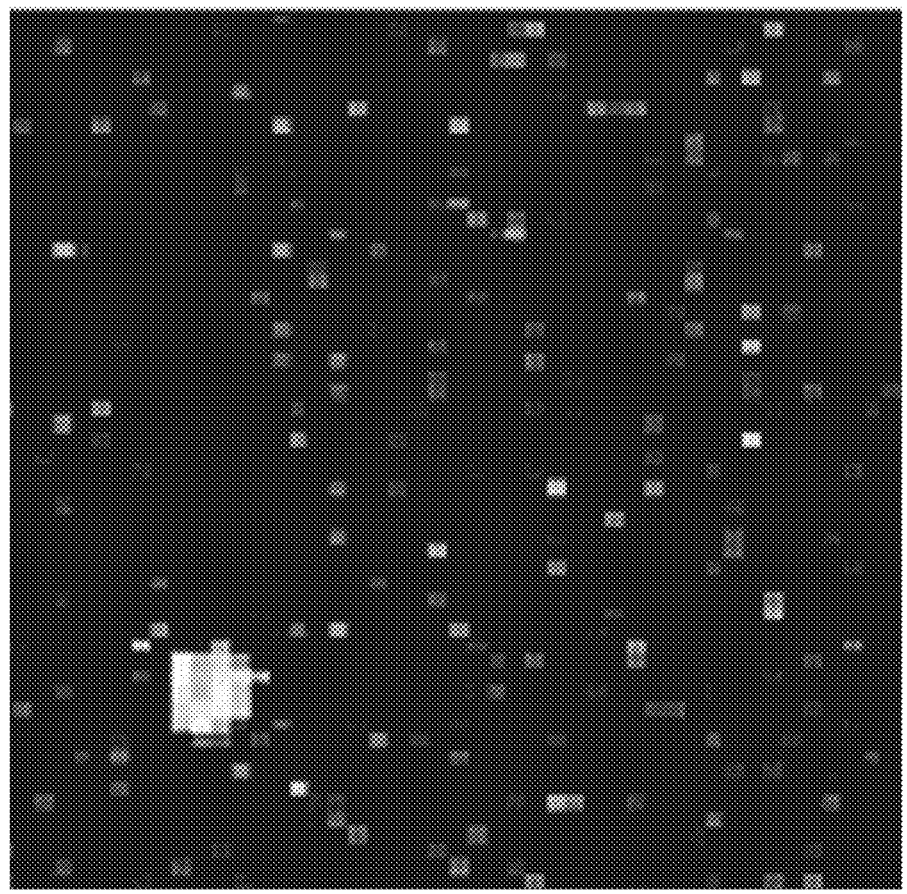
FIG. 10D shows AES element distribution mapping of Ni in the double atomic layer nanoribbon shown in FIG. 10A prepared according to Example III.

FIGS. 10B-10D show Auger electron spectroscopy (AES) element distribution mapping of the double atomic layer nanoribbon as shown in FIG. 10A and as prepared according to Example III. In particular, FIG. 10B shows AES mapping of S, FIG. 10C shows AES mapping of Mo, and FIG. 10D shows AES mapping of Ni. From FIGS. 10B-10D, it was determined that double atomic layer nanoribbon comprised Mo and S with a Mo:S atom ratio 1:2, and that the nanoparticle comprised Ni, Mo, and S.

Figure 11A:
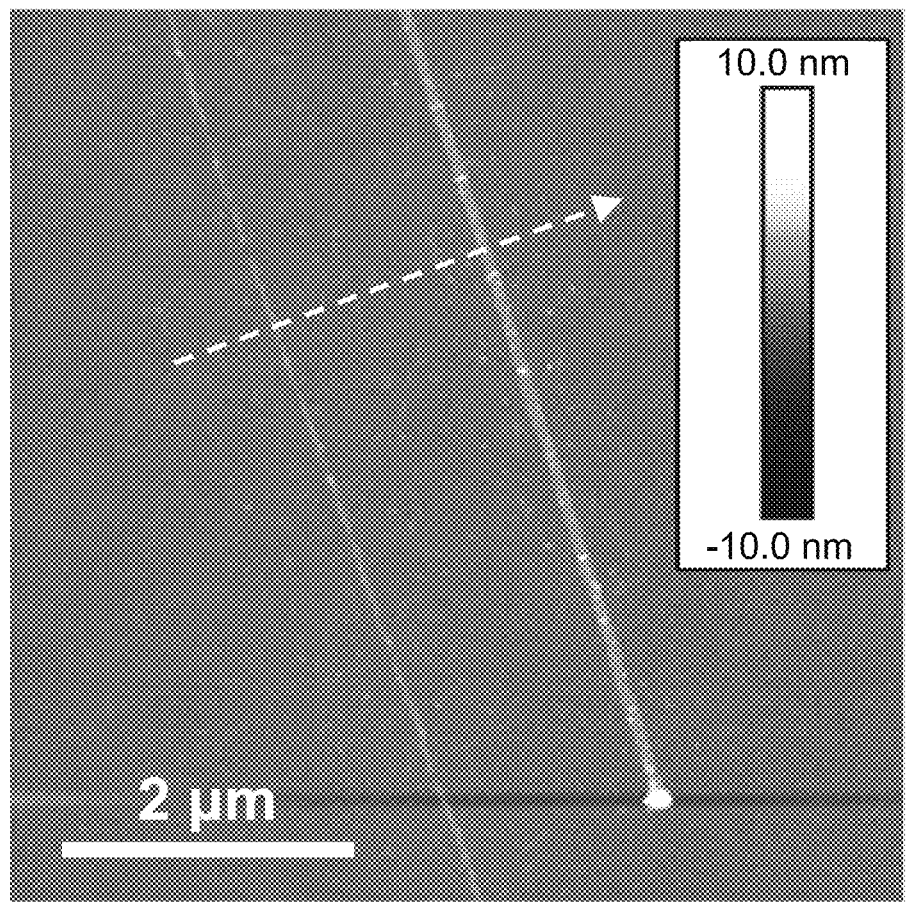
FIG. 11A shows an AFM image of the double atomic layer nanoribbon prepared according to Example III.
Figure 11B:
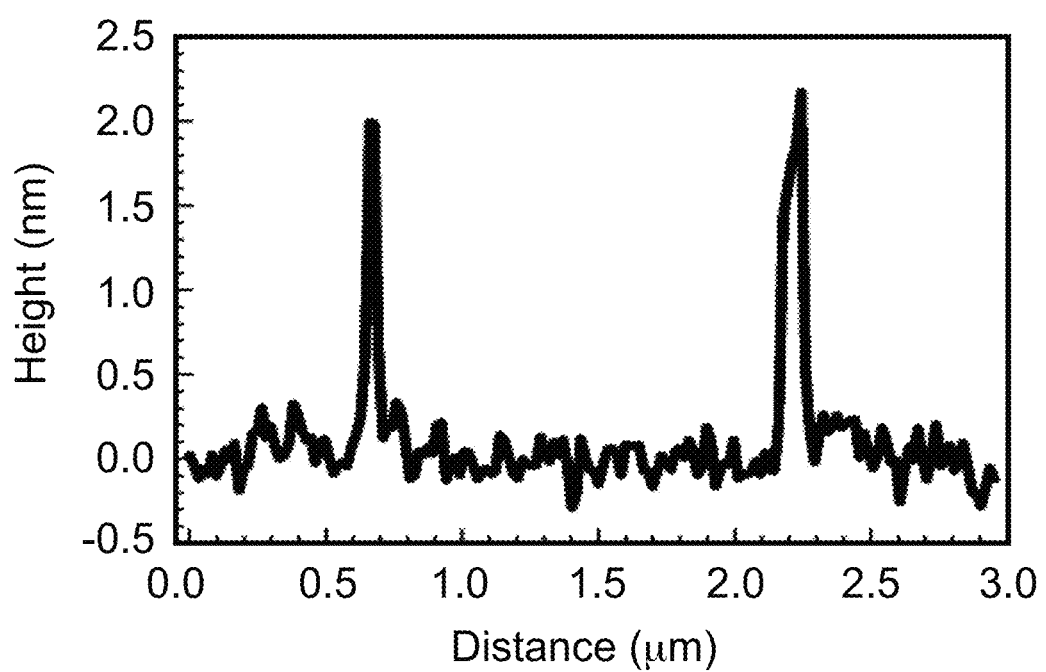
FIG. 11B shows the height profile along the dashed arrow of FIG. 11A.

Example V(c): Atomic Force Microscopy Characterization of Double Atomic Layer Nanoibbon FIG. 11A shows an AFM image of the double atomic layer nanoribbon prepared according to Example III with topological information. FIG. 11B shows the height profile along the dashed arrow of FIG. 11A. The height profile confirms that the nanoribbon is a bilayer having a thickness of about 2 nm.

The invention claimed is:

1. A double atomic layer ribbon comprising a first monolayer, a second monolayer on a surface of the first monolayer, and a metal-containing nanoparticle at an end of the second monolayer,
wherein the double atomic layer ribbon is formed by subjecting two or more precursor powders to a moisturized gas flow at a temperature sufficient to deposit the double atomic layer ribbon on a substrate via chemical vapor deposition,
wherein the first monolayer has a first average width and the second monolayer has a second average width that is less than the first average width, and
wherein the first monolayer comprises a first transition metal dichalcogenide material having a first transition metal and a first dichalcogenide, and the second monolayer comprises a second transition metal dichalcogenide material having a second transition metal and a second dichalcogenide.

2. The double atomic layer ribbon according to claim 1, wherein the first average width is between about 0.1 and about 100 μm.

3. The double atomic layer ribbon according to claim 1, wherein the second average width is between about 5 and 100 nm.

4. The double atomic layer ribbon according to claim 1, wherein the metal-containing nanoparticle comprises Ni or Fe.

5. The double atomic layer ribbon according to claim 4, wherein the metal-containing nanoparticle further comprises Mo, S, or a combination thereof.

6. The double atomic layer ribbon according to claim 5, wherein the metal-containing nanoparticle is a Ni—Mo—S nanoparticle or an Fe—Mo—S nanoparticle.

7. The double atomic layer ribbon according to claim 4, wherein at least one of the first transition metal dichalcogenide material and the second transition metal dichalcogenide material comprises molybdenum disulfide.

8. The double atomic layer ribbon according to claim 1, wherein the metal-containing nanoparticle comprises a metal that is different from the second transition metal.

9. A double atomic layer ribbon comprising a first monolayer, a second monolayer on a surface of the first monolayer, and a metal-containing nanoparticle at an end of the second monolayer, and
wherein the first monolayer comprises a first transition metal dichalcogenide material having a first transition metal and a first dichalcogenide, and the second monolayer comprises a second transition metal dichalcogenide material having a second transition metal and a second dichalcogenide.

10. The double atomic layer ribbon of claim 9, wherein the metal-containing nanoparticle comprises nickel, iron, or a combination thereof.

11. The double atomic layer ribbon according to claim 9, wherein at least one of the first transition metal dichalcogenide material and the second transition metal dichalcogenide material comprises molybdenum disulfide.

12. The double atomic layer ribbon according to claim 9, wherein the first monolayer has a first average width and the second monolayer has a second average width.

13. The double atomic layer ribbon according to claim 12, wherein the first average width is the same as the second average width.

14. The double atomic layer ribbon according to claim 12, wherein the first average width is different from the second average width.

15. The double atomic layer ribbon according to claim 12, wherein the metal-containing nanoparticle comprises a metal that is different from the second transition metal.

\* \* \* \* \*